(12) United States Patent
Nakashikiryo

(10) Patent No.: US 10,741,597 B2
(45) Date of Patent: Aug. 11, 2020

(54) IMAGE SENSOR, IMAGING APPARATUS, AND METHOD OF MANUFACTURING IMAGE SENSOR

(71) Applicant: KYOCERA Corporation, Kyoto-shi, Kyoto (JP)

(72) Inventor: Takashi Nakashikiryo, Koshi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/551,229

(22) PCT Filed: Feb. 26, 2016

(86) PCT No.: PCT/JP2016/001057
§ 371 (c)(1),
(2) Date: Aug. 15, 2017

(87) PCT Pub. No.: WO2016/136274
PCT Pub. Date: Sep. 1, 2016

(65) Prior Publication Data
US 2018/0040655 A1    Feb. 8, 2018

(30) Foreign Application Priority Data

Feb. 26, 2015  (JP) .................................. 2015-037425
Feb. 26, 2015  (JP) .................................. 2015-037461
Feb. 26, 2015  (JP) .................................. 2015-037464

(51) Int. Cl.
*H01L 35/32*      (2006.01)
*H01L 27/146*     (2006.01)

(52) U.S. Cl.
CPC .. *H01L 27/14627* (2013.01); *H01L 27/14601* (2013.01); *H01L 27/14607* (2013.01);
(Continued)

(58) Field of Classification Search
None
See application file for complete search history.

(56) References Cited

U.S. PATENT DOCUMENTS 6,559,538 B1 *  5/2003  Pomerene ............... H01L 23/38
                                                    257/467
6,620,994 B2 *  9/2003  Rossi ....................... H01L 35/16
                                                    136/201
(Continued)

FOREIGN PATENT DOCUMENTS

JP      62-180930      *   8/1987
JP      S62-180930 A       8/1987
(Continued)

OTHER PUBLICATIONS

International Search Report (Form PCT/ISA/210) dated May 10, 2016, issued for PCT/J P2016/001057.
(Continued)

*Primary Examiner* — Ali Naraghi

(57) ABSTRACT

An image sensor, an imaging apparatus, and a method of manufacturing an image sensor with an improved heat dissipation effect. An image sensor includes a first layer having an imaging function, pixels being arranged in the first layer in at least a first direction, and a second layer joined to the first layer. The second layer includes a first sublayer, and primary material regions including primary material and secondary material regions including secondary material are arranged alternately in the first direction in the first sublayer.

18 Claims, 29 Drawing Sheets

(52) U.S. Cl.
CPC .. *H01L 27/14632* (2013.01); *H01L 27/14683* (2013.01); *H01L 27/1464* (2013.01); *H01L 27/14618* (2013.01)

(56) References Cited

U.S. PATENT DOCUMENTS

| | | | |
|---|---|---|---|
| 9,379,167 B2* | 6/2016 | Chen | ................... H01L 27/3225 |
| 9,515,245 B2* | 12/2016 | Hussain | ................... H01L 27/16 |
| 9,620,698 B2* | 4/2017 | Lane | ................... H01L 35/32 |
| 2008/0224188 A1* | 9/2008 | Han | ................... H01L 23/38 |
| | | | 257/292 |
| 2013/0270662 A1 | 10/2013 | Roy et al. | |
| 2014/0160327 A1 | 6/2014 | Enoki et al. | |
| 2014/0190543 A1* | 7/2014 | Chen | ................... H01L 35/32 |
| | | | 136/224 |
| 2014/0291790 A1 | 10/2014 | Hsiao et al. | |

FOREIGN PATENT DOCUMENTS

| | | | |
|---|---|---|---|
| JP | 2001-177023 A | | 6/2001 |
| JP | 2004-146633 A | * | 5/2004 |
| JP | 2004-221248 A | | 8/2004 |
| JP | 2007-165527 A | * | 6/2007 |
| JP | 2009-004814 A | | 1/2009 |
| JP | 2015-015631 A | | 1/2015 |
| WO | 2014/192199 A1 | | 12/2014 |
| WO | WO 2014/192199 | * | 12/2014 |

OTHER PUBLICATIONS

Written Opinion (Form PCT/ISA/237) dated May 10, 2016, issued for PCT/JP2016/001057 with Concise Explanation.

* cited by examiner

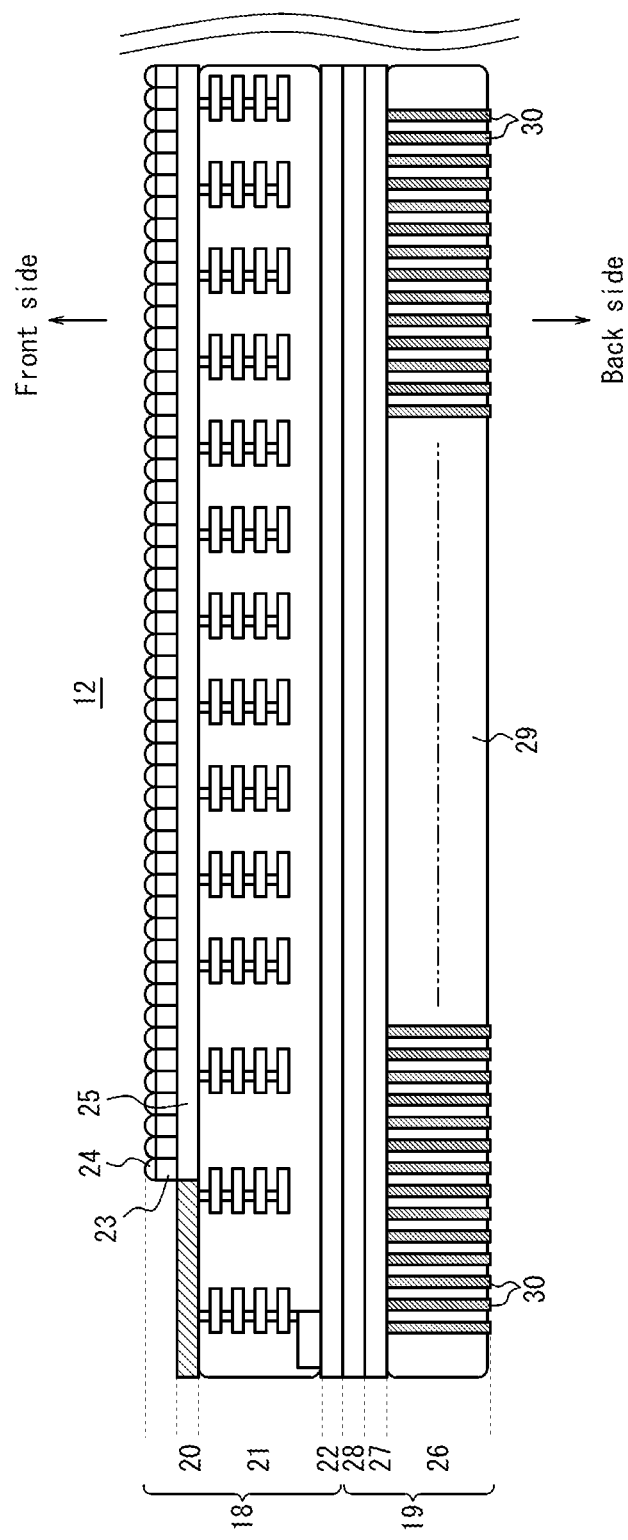

IMAGE SENSOR, IMAGING APPARATUS, AND METHOD OF MANUFACTURING IMAGE SENSOR

CROSS-REFERENCE TO RELATED APPLICATIONS

This application claims priority to and the benefit of Japanese Patent Application No. 2015-037425, Japanese Patent Application No. 2015-037461, and Japanese Patent Application No. 2015-037464 filed Feb. 26, 2015, the entire disclosure of these earlier applications being incorporated herein by reference.

TECHNICAL FIELD

This disclosure relates to an image sensor that outputs an image signal, an imaging apparatus, and a method of manufacturing an image sensor.

BACKGROUND

Conventional imaging apparatuses include an image sensor, such as a CCD image sensor or a CMOS image sensor, and an imaging optical system.

SUMMARY

An image sensor according to an embodiment of this disclosure includes: a first layer having an imaging function, a plurality of pixels being arranged in the first layer in at least a first direction; and a second layer joined to the first layer; such that the second layer includes a first sublayer, and primary material regions including primary material and secondary material regions including secondary material are arranged alternately in the first direction in the first sublayer.

An imaging apparatus according to an embodiment of this disclosure includes: an image sensor including a first layer and a second layer joined to the first layer, the first layer having an imaging function, a plurality of pixels being arranged in the first layer in at least a first direction; and an imaging optical system configured to form an image of a subject on a light receiving surface of the first layer, such that the second layer includes a first sublayer, and primary material regions including primary material and secondary material regions including secondary material are arranged alternately in the first direction in the first sublayer.

A method of manufacturing an image sensor according to an embodiment of this disclosure includes: forming a photodiode on one surface of a first substrate; forming a second sublayer on the one surface of the first substrate; depositing a metallic material different from a primary material of a second substrate in grooves formed in a predetermined pattern on one surface of the second substrate; forming a second sublayer on the one surface of the second substrate; joining the second sublayer of the first substrate and the second sublayer of the second substrate; polishing another surface of the first substrate opposite the one surface of the first substrate to form a photoelectric conversion sublayer; and polishing another surface of the second substrate opposite the one surface of the second substrate to form a first sublayer.

BRIEF DESCRIPTION OF THE DRAWINGS

In the accompanying drawings:

FIG. 3 is a cross-sectional diagram of the image sensor in FIG. 1;

DETAILED DESCRIPTION

For example, a configuration to keep the image sensor from overheating by allowing heat generated in the image sensor to escape through a heat conduction member to a metal plate outside a resin housing is disclosed. Furthermore, to increase the angle of incidence of the principal ray, a configuration in which the connection of the microlens provided at the opening of each pixel in the image sensor has a Fresnel shape is disclosed.

Embodiments of this disclosure are described below, with reference to the drawings.

Embodiment 1

Figure 1:
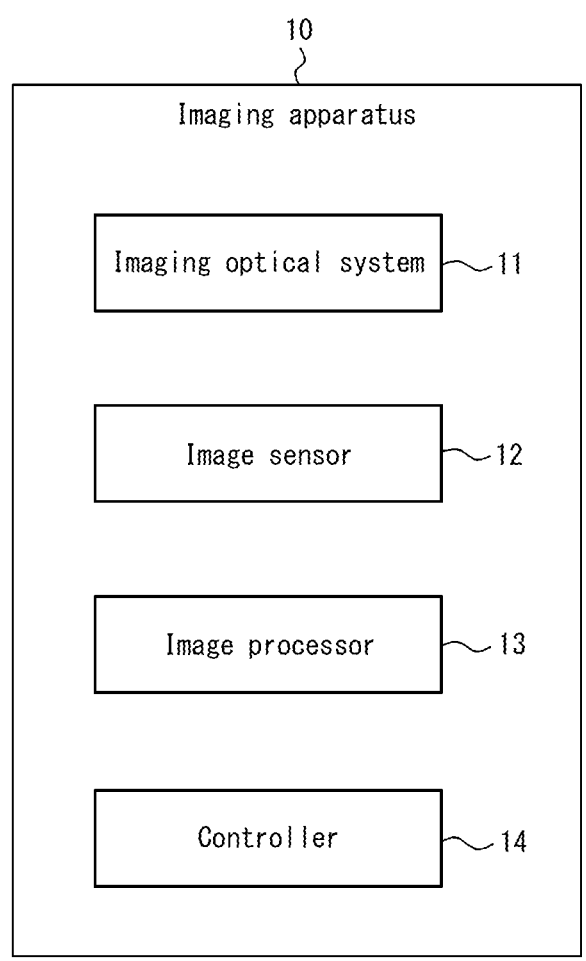
FIG. 1 is a block diagram illustrating the configuration of an imaging apparatus according to Embodiment 1 of this disclosure.

An imaging apparatus according to Embodiment 1 of this disclosure is described first. As illustrated in FIG. 1, an imaging apparatus 10 includes an imaging optical system 11, an image sensor 12, an image processor 13, and a controller 14.

The imaging optical system 11 includes an aperture and a plurality of lenses and forms an image of a subject.

The image sensor 12 may, for example, be a CMOS image sensor and captures a subject image formed by the imaging optical system 11. The image sensor 12 also outputs the image generated by imaging to the image processor 13 as an analog image signal. In this embodiment, the image sensor 12 is described as being back-illuminated, but this example is not limiting.

The image processor 13 includes a dedicated processor for image processing, such as an AFE or a DSP, and performs pre-image processing, such as CDS, gain adjustment (AGC), and AD conversion (ADC) on the image signal acquired from the image sensor 12. The image processor 13 also performs predetermined post-image processing, such as automatic exposure (AE), automatic white balance (AWB), color interpolation, brightness correction, color correction, and gamma correction on the captured image.

The controller 14 is, for example, a dedicated microprocessor or is a general-purpose CPU that executes specific processing by reading a specific program. The controller 14 controls overall operations of the imaging apparatus 10.

Figure 2:
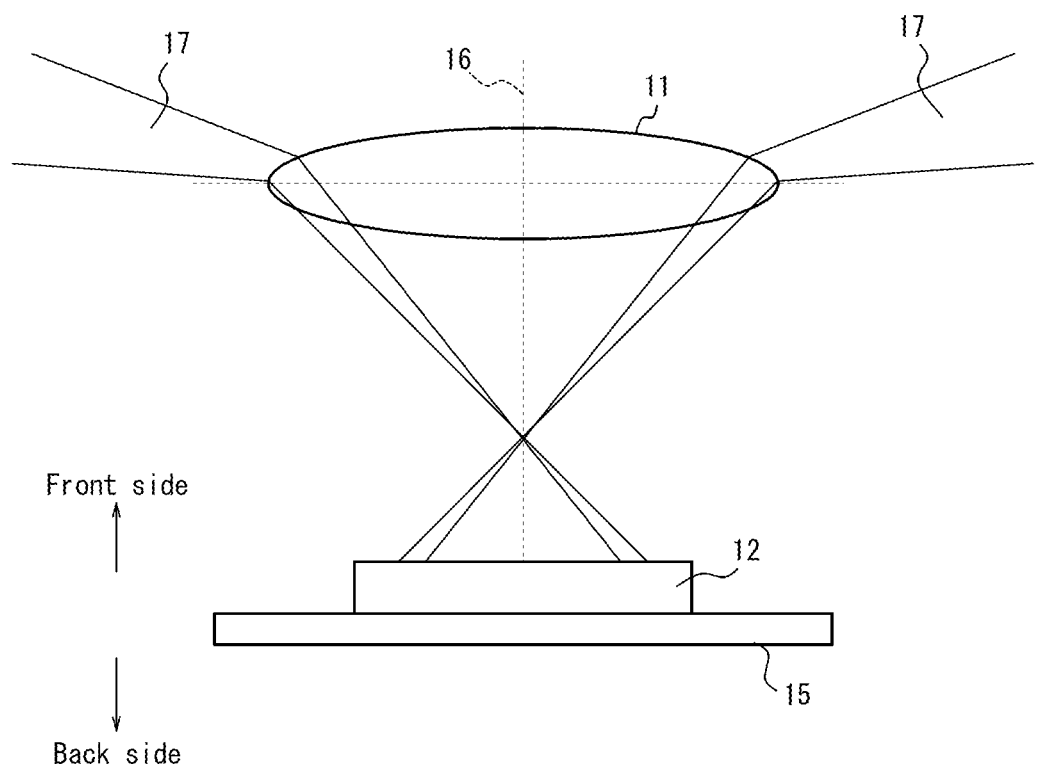
FIG. 2 illustrates the positional relationship between the image sensor and the imaging optical system in FIG. 1.

The positional relationship between the imaging optical system 11 and the image sensor 12 is described next. As illustrated in FIG. 2, the image sensor 12 joined to a package substrate 15 is disposed within a housing of the imaging apparatus 10 so that the image sensor 12 is centered on the optical axis 16 of the imaging optical system 11 and light 17 passing through the imaging optical system 11, i.e. the subject image, is formed on the light receiving surface of the image sensor 12. Hereinafter, the light receiving surface side of the image sensor 12 (the top in FIG. 2) is referred to as the front side, and the joining surface side of the package substrate 15 (the bottom in FIG. 2) is referred to as the back side.

Next, the configuration of the image sensor 12 is described in detail. As illustrated in FIG. 3, the image sensor 12 includes a first layer 18 and a second layer 19. For the sake of illustration, the constituent elements of the image sensor 12 are not to scale in FIG. 3. Furthermore, FIG. 3 is a cross-sectional diagram of the image sensor 12 in at least one direction (first direction) in which a plurality of pixels of the image sensor 12 are arranged.

The first layer 18 has an imaging function to output captured image signals from the pixels and has, for example, a thickness of approximately 3 μm to 4 μm. The first layer 18 includes a photoelectric conversion sublayer 20, a wiring sublayer 21, an adhesive sublayer 22, a color filter 23, and microlenses 24.

The photoelectric conversion sublayer 20 includes a semiconductor material, such as silicon, as a primary material. Photodiodes 25 and MOS transistors constituting pixels are formed in one region of the photoelectric conversion sublayer 20. The principal surface at the front side of the photoelectric conversion sublayer 20 is the light-receiving surface of the image sensor 12.

The wiring sublayer 21 includes an insulating material, such as silicon oxide, as a primary material. Circuits that read captured image signals from pixels are formed in one region of the wiring sublayer 21. The circuits are configured by layering wires made, for example, of copper, aluminum, or the like. The wiring sublayer 21 is provided on the back side adjacent to the photoelectric conversion sublayer 20.

The adhesive sublayer 22 is configured by a highly adhesive material, such as silicon nitride. The adhesive sublayer 22 is disposed at the back side, adjacent to the wiring sublayer 21, and is used to join the first layer 18 and the second layer 19 so that these layers are in close contact.

The color filter 23 is a filter that, for example, corresponds to each of the RGB colors and transmits light in a particular wavelength band. The color filter 23 is provided in correspondence with each pixel. The color filter 23 is provided on the front side adjacent to the photoelectric conversion sublayer 20 in the region where the photodiodes 25 of the photoelectric conversion sublayer 20 are formed.

The microlenses 24 are lenses provided in correspondence with each pixel. The microlenses 24 focus light irradiated through the imaging optical system 11 onto the light receiving surface of the image sensor 12 through the color filter 23.

The second layer 19 supports the first layer 18 and has, for example, a thickness of approximately 170 μm. The second layer 19 includes a support sublayer 26 (first sublayer), a metallic sublayer 27, and an adhesive sublayer 28 (second sublayer).

The support sublayer 26 includes a non-metallic material, such as silicon or glass, as a primary material. In the support sublayer 26, primary material regions including primary material 29 and secondary material regions including secondary material 30 are arranged (positioned) alternately in the first direction. The secondary material 30 arranged in the support sublayer 26 functions as a heat sink to dissipate heat generated in the first layer 18 from the second layer side. The properties of the materials and the distribution thereof in the width direction of the secondary material 30, i.e. in the first direction, are determined freely to obtain the desired heat dissipation. In this embodiment, the primary material regions are non-metallic material regions including the non-metallic primary material 29, such as silicon. The secondary material regions are metallic material regions including the metallic secondary material 30, such as copper, which has higher thermal conductivity than the primary material 29. The secondary material 30 is preferably distributed uniformly (for example, at even intervals) across at least a partial region in the first direction. In other words, in a cross-section along the first direction, the support sublayer 26 has a portion in which the metallic material regions are uniformly arranged. Also, the secondary material 30 preferably extends to the principal surface at the back side of the second layer 19.

Figure 4A:
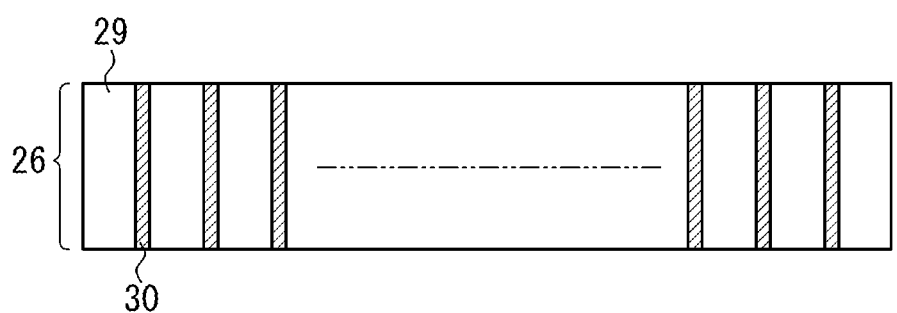
FIGS. 4A, 4B, and 4C illustrate a variation on the support sublayer in FIG. 3.
Figure 4B:
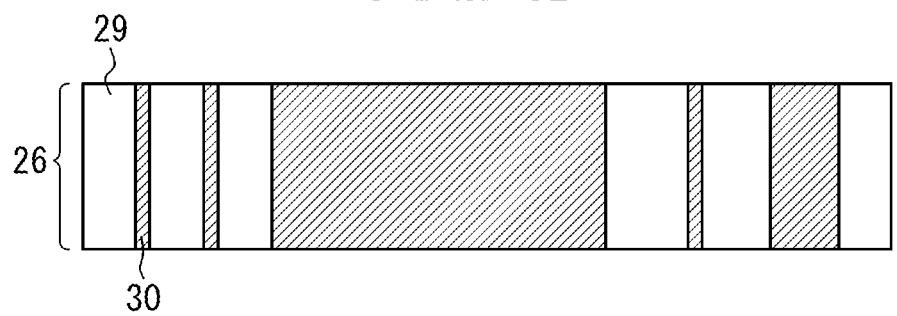
Figure 4C:
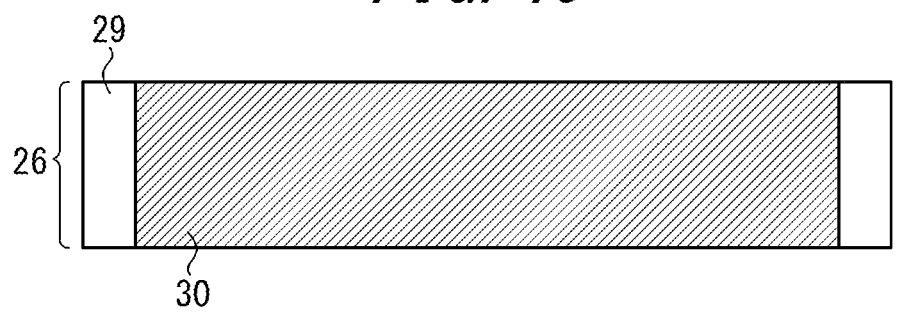

Examples of distribution of the secondary material 30 arranged in the support sublayer 26 are now described with reference to FIGS. 4A, 4B, and 4C. The distribution of the secondary material 30 may, for example, be uniform across the entire length in the first direction, as illustrated in FIG. 4A. Alternatively, the distribution of the secondary material 30 may be uneven, as illustrated in FIG. 4B. The secondary material 30 may, for example, also be arranged in one region in the first direction, with the primary material 29 being arranged in the other regions, as illustrated in FIG. 4C. In this way, the distribution of secondary material 30 arranged in the support sublayer 26 may be determined freely to obtain the desired heat dissipation.

The metallic sublayer 27 illustrated in FIG. 3 is a layer that has higher thermal conductivity than the primary material 29 of the support sublayer 26. In this embodiment, the metallic sublayer 27 is described as being a layer that includes the same material as the secondary material 30 of the support sublayer 26, but the metallic sublayer 27 may include a different material instead. The metallic sublayer 27 is disposed at the front side adjacent to the support sublayer 26, and conducts heat generated in the first layer 18 to the secondary material 30 arranged in the support sublayer 26 across the entire surface of the first layer 18.

The adhesive sublayer 28 is configured by a highly adhesive material, such as silicon nitride. The adhesive sublayer 28 is disposed at the front side, adjacent to the metallic sublayer 27, and is used to join the first layer 18 and the second layer 19 so that these layers are in close contact.

Next, the procedure for forming the first layer 18 and the second layer 19 is described with reference to FIGS. 5A through 7E. This procedure is performed using two substrates (first substrate and second substrate). An example of this procedure is described below as being divided into a procedure to process the first substrate, a procedure to process the second substrate, and a procedure to join the first substrate and the second substrate. This procedure for forming the first layer 18 and the second layer 19 is, for example, incorporated into a pre-process of a semiconductor process. The first substrate and the second substrate are described as being typical silicon semiconductor substrates, for example.

(Procedure to Process the First Substrate)

Figure 5A:
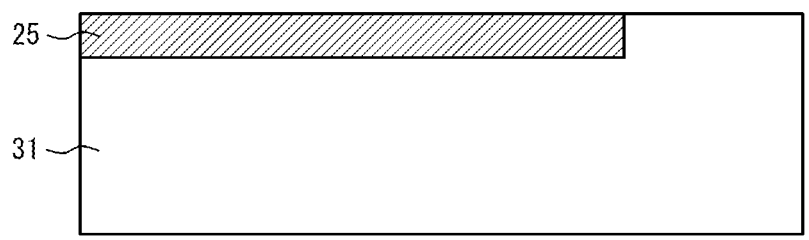
FIGS. 5A and 5B are cross-sectional diagrams of a substrate to illustrate a method of manufacturing the image sensor in FIG. 1.
Figure 5B:
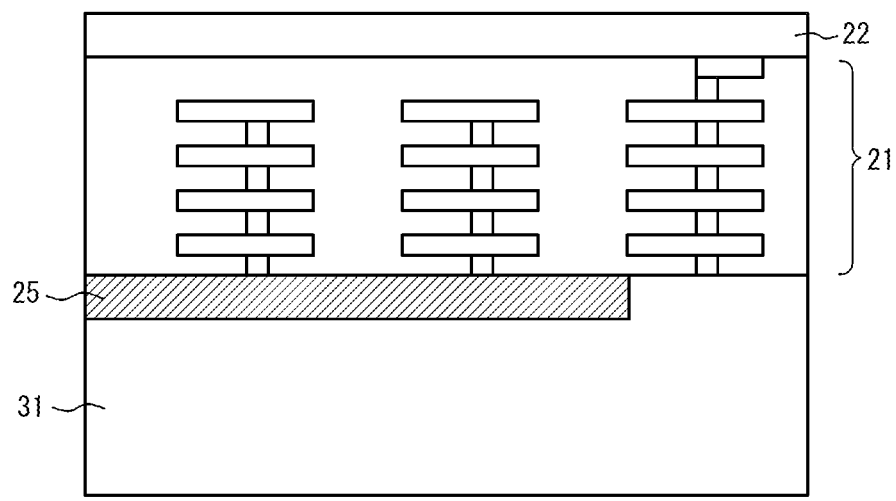

First, the procedure to process the first substrate is described. As illustrated in FIG. 5A, the photodiodes 25 and MOS transistors are first formed on a flattened, principal surface of a first substrate 31. Next, as illustrated in FIG. 5B, the wiring sublayer 21 is formed on this principal surface of the first substrate 31, and the adhesive sublayer 22 is further formed by layering a silicon nitride film, for example.

(Procedure to Process the Second Substrate)

Figure 6A:
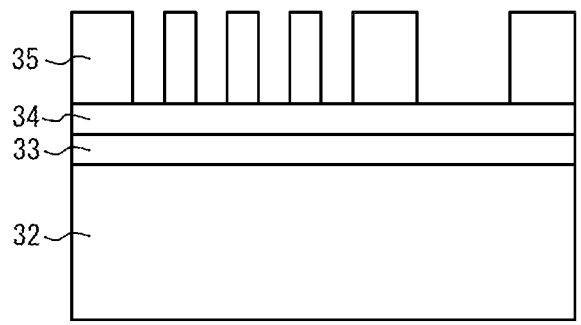
FIGS. 6A, 6B, 6C, 6D, and 6E are cross-sectional diagrams of the substrate to illustrate the method of manufacturing the image sensor in FIG. 1.
Figure 6B:
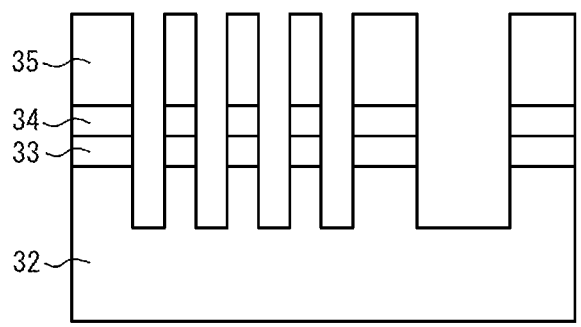
Figure 6C:
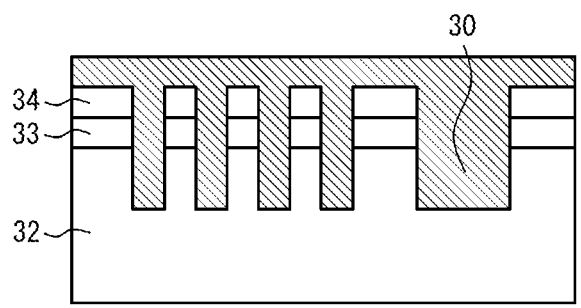
Figure 6D:
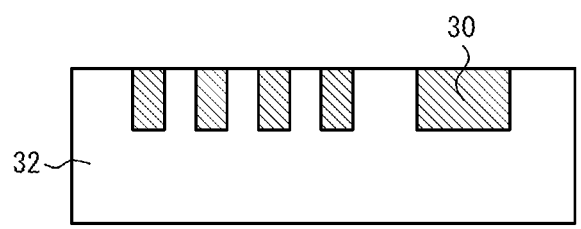
Figure 6E:
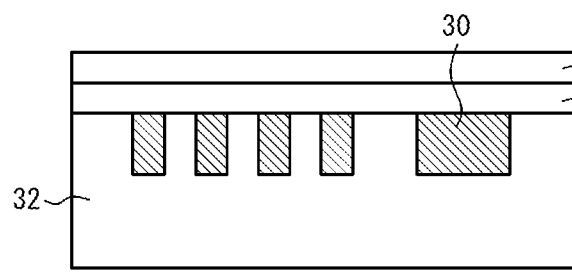

Next, the procedure to process the second substrate is described. As illustrated in FIG. 6A, a silicon oxide film 33 and a silicon nitride film 34 are first formed on a flattened, principal surface of a second substrate 32, a photoresist 35 is applied, and patterning is performed. Next, as illustrated in FIG. 6B, etching is performed to form grooves in the principal surface of the second substrate 32. As illustrated in FIG. 6C, the photoresist 35 is then removed, and metallic material such as copper is deposited as the secondary material 30 by any treatment, such as vapor deposition or plating. Subsequently, as illustrated in FIG. 6D, flattening is performed and the silicon oxide film 33 and silicon nitride film 34 are removed. As illustrated in FIG. 6E, the metallic sublayer 27 is then formed by layering a metallic material, such as copper, and the adhesive sublayer 28 is formed by layering a silicon nitride film, for example.

(Procedure to Join the First Substrate and the Second Substrate)

Figure 7A:
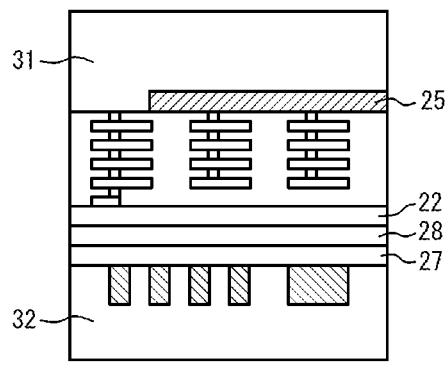
FIGS. 7A, 7B, 7C, 7D, and 7E are cross-sectional diagrams of the substrate to illustrate the method of manufacturing the image sensor in FIG. 1.
Figure 7B:
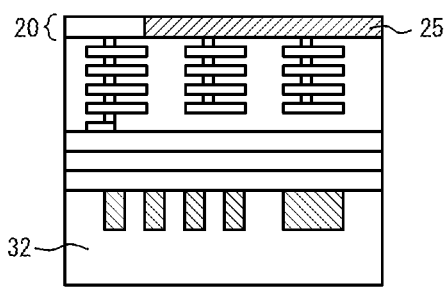
Figure 7C:
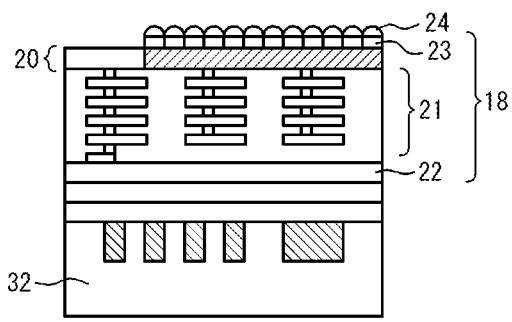
Figure 7D:
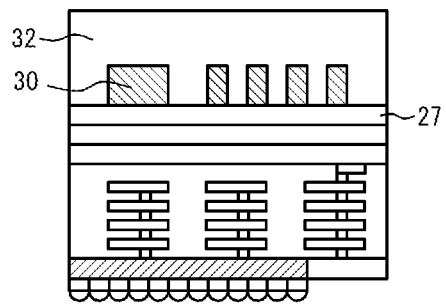
Figure 7E:
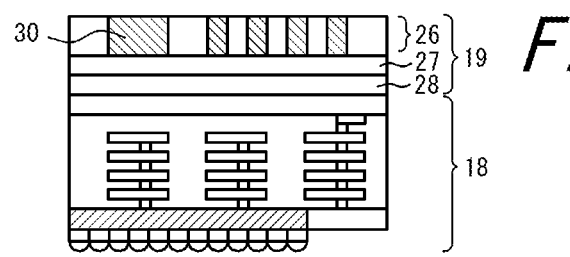

Next, the procedure to join the first substrate 31 and the second substrate 32 is described. As illustrated in FIG. 7A, the adhesive sublayer 22 of the first substrate 31 and the adhesive sublayer 28 of the second substrate 32 are first joined. Next, as illustrated in FIG. 7B, the other principal surface of the first substrate 31 is polished. The other principal surface is, for example, polished until the photodiodes 25 are exposed, thereby forming the photoelectric conversion sublayer 20. Next, as illustrated in FIG. 7C, the color filter 23 and microlenses 24 are disposed on the photoelectric conversion sublayer 20. The first layer 18 including the adhesive sublayer 22, the wiring sublayer 21, the photoelectric conversion sublayer 20, the color filter 23, and the microlenses 24 is thus formed. Subsequently, as illustrated in FIG. 7D, the second substrate 32 on which the first layer 18 is formed is turned upside down. As illustrated in FIG. 7E, the other principal surface of the second substrate 32 is then polished to form the support sublayer 26. The other principal surface is preferably polished until the secondary material 30 is exposed, thereby forming the support sublayer 26. The second layer 19 that includes the support sublayer 26, the metallic sublayer 27, and the adhesive sublayer 28 is thus formed. An image sensor wafer that includes the first layer 18 and the second layer 19 is obtained by the above-described procedure.

Next, the flow of the above-described procedure for forming the first layer 18 and the second layer 19 is described with reference to the flowchart in FIG. 8.

Step S100: First, the photodiodes 25 and MOS transistors are formed on one principle surface of the first substrate 31.

Step S101: Subsequently, the wiring sublayer 21 is formed on this principal surface of the first substrate 31, and the adhesive sublayer 22 is further formed by layering a silicon nitride film, for example.

Step S102: Next, the silicon oxide film 33, the silicon nitride film 34, and the pattern of the photoresist 35 are formed on a principal surface of the second substrate 32, and grooves are formed in the principal surface of the second substrate 32 by etching.

Step S103: Subsequently, the photoresist 35 of the second substrate 32 is removed, and a metallic material, such as copper, is deposited as the secondary material 30.

Step S104: Subsequently, the second substrate 32 is subjected to flattening to remove the silicon oxide film 33 and the silicon nitride film 34.

Step S105: Subsequently, the metallic sublayer 27 is formed on the second substrate 32 by layering a metallic material, such as copper, and the adhesive sublayer 28 is further formed by layering a silicon nitride film, for example.

Step S106: Next, the adhesive sublayer 22 of the first substrate 31 and the adhesive sublayer 28 of the second substrate 32 are joined.

Step S107: Subsequently, the other principal surface of the first substrate 31, opposite the principal surface in step S100, is polished to form the photoelectric conversion sublayer 20.

Step S108: Subsequently, the color filter 23 and microlenses 24 are disposed on the photoelectric conversion sublayer 20. The first layer 18 including the adhesive sublayer 22, the wiring sublayer 21, the photoelectric conversion sublayer 20, the color filter 23, and the microlenses 24 is thus formed.

Step S109: Subsequently, the other principal surface of the second substrate 32, opposite the principal surface in step S102, is polished. The other principal surface is preferably polished until the secondary material 30 is exposed, thereby forming the support sublayer 26. The second layer 19 that includes the support sublayer 26, the metallic sublayer 27, and the adhesive sublayer 28 is thus formed.

Figure 9:
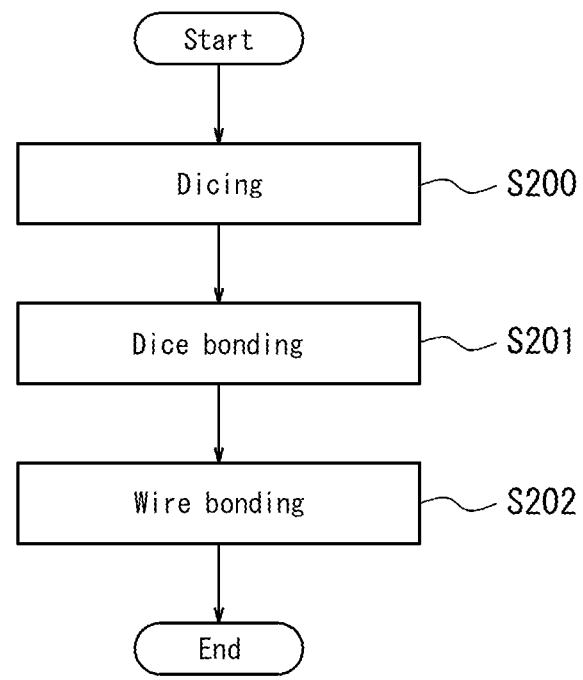
FIG. 9 is a flowchart to illustrate a post-process in the method of manufacturing the image sensor in FIG. 1.

Next, the flow of the procedure to process the image sensor wafer in which the first layer 18 and the second layer 19 are formed is described with reference to the flowchart in FIG. 9. This procedure is, for example, incorporated into a post-process of a semiconductor process.

Step S200: First, the image sensor wafer is cut into the desired chip size by dicing.

Step S201: Subsequently, the image sensor 12, which was cut into the desired chip size, is joined to a package substrate 15 by dice bonding. For example, the image sensor 12 is joined to the lead frame of the package substrate 15 by adhesion.

Step S202: Wire bonding is then performed to connect the pad of the image sensor 12 to the pad of the package substrate 15.

In this way, the image sensor 12 according to Embodiment 1 includes the first layer 18 and the second layer 19, which includes the support sublayer 26 in which the primary material 29 and a metallic material, i.e. the secondary material 30, are arranged alternately. The alternately arranged secondary material 30 functions as a heat sink to dissipate heat generated in the first layer 18 from the second layer 19 side. When, for example, the back surface of an image sensor is configured to contact a heat conduction member, heat generated in the sensor portion of the image sensor needs to be conducted sufficiently to the back surface of the image sensor. In this regard, since the second layer 19 that includes the secondary material 30 functioning as a heat sink is joined to the heat-generating first layer 18 in the image sensor 12 according to Embodiment 1, heat generated at the first layer 18 is conducted more efficiently to the back surface of the second layer 19, thereby improving the heat dissipation effect. Furthermore, the second layer 19 can, for example, be formed by the polishing in the above-described step S109 (see FIG. 8) during a pre-process of a semiconductor process. By causing the secondary material 30 included in the second layer 19 to function as a heat sink, an additional procedure after the polishing in step S109, i.e. an additional procedure when the image sensor 12 is relatively thin, is unnecessary. An increase in the difficulty of manufacturing the image sensor 12 is thereby prevented.

The secondary material 30 arranged in the support sublayer 26 extends to the principal surface of the second layer 19 on the opposite side of the first layer 18, i.e. to the principal surface at the back side of the second layer 19. In this way, for example upon joining the image sensor 12 to the package substrate 15, the secondary material 30 arranged in the second layer 19 and the package substrate 15 come into contact, further improving the heat dissipation effect.

The secondary material 30 is distributed uniformly in the support sublayer 26 across at least a partial region in the first direction. In this way, in a cross-section along the first direction, the support sublayer 26 has a portion in which the metallic material regions are uniformly arranged. By distributing the secondary material 30 uniformly, the secondary material 30 can be distributed densely in the regions, increasing the surface area of the heat sink and further improving the heat dissipation effect.

The second layer 19 includes the support sublayer 26, the metallic sublayer 27, and the adhesive sublayer 28. As described above, the metallic sublayer 27 conducts heat generated in the first layer 18 to the secondary material 30 arranged in the support sublayer 26 across the entire surface of the first layer 18, thereby further improving the heat dissipation effect.

The image sensor 12 is a back-illuminated image sensor. Typically, a back-illuminated image sensor is manufactured by joining a support substrate to a substrate on which photodiodes, a wiring layer, and the like are formed. The support substrate can therefore be used as the second substrate 32 according to this embodiment, preventing an increase in costs and allowing a reduction in thickness of the image sensor 12.

The method of manufacturing the image sensor 12 according to Embodiment 1 forms the photodiodes 25 on one principal surface of the first substrate 31, deposits the secondary material 30 in grooves formed on one principal surface of the second substrate 32, joins the first substrate 31 and the second substrate 32, subsequently polishes the other principal surface of the first substrate 31 to form the photoelectric conversion sublayer 20, and polishes the other principal surface of the second substrate 32 to form the support sublayer 26. During the polishing to form the support sublayer 26, the endpoint of polishing can be determined with reference to the thickness of the secondary material 30 deposited on the second substrate 32, thereby improving the film thickness controllability.

In Embodiment 1, the second layer 19 has been described as including the metallic sublayer 27, but this configuration is not limiting. For example, the second layer 19 may include the support sublayer 26 and the adhesive sublayer 28 without including the metallic sublayer 27. In this case, the metallic sublayer 27 need not be formed, thereby reducing the manufacturing costs of the image sensor 12.

Embodiment 2

Next, Embodiment 2 is described. Overall, the image sensor 12 according to Embodiment 2 differs from Embodiment 1 in the shape of the principal surface at the back side of the second layer 19. Also, a method of manufacturing the imaging apparatus 10 according to Embodiment 2 differs from Embodiment 1 in the timing at which polishing to form the second layer 19 (step S109) is ended and in the details of the joining method during dice bonding (step S201). The following describes the differences from Embodiment 1.

As in Embodiment 1, the imaging optical system 11 of the imaging apparatus 10 according to Embodiment 2 includes an aperture and a plurality of lenses and forms an image of a subject. In this embodiment, the imaging optical system 11 has a wide angle of view and can, for example, focus principal rays with an angle of incidence of 90° or greater.

Figure 10:
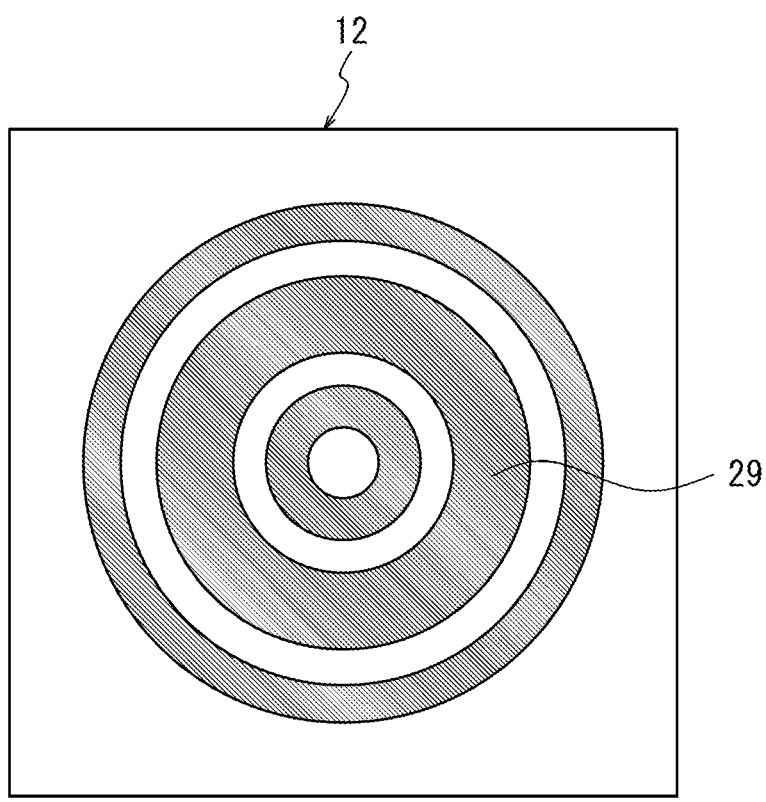
FIG. 10 is a bottom view of an image sensor according to Embodiment 2 of this disclosure.

As in Embodiment 1, the primary material 29 and the secondary material 30 are arranged alternately in the first direction in the support sublayer 26 of the second layer 19 provided in the image sensor 12. For example, the primary material 29, such as silicon, of the support sublayer 26 is arranged alternately with the secondary material 30, which differs in hardness from the primary material 29 and is a metallic material, such as copper, as in Embodiment 1. When viewing the second layer 19 from the back side, for example as illustrated in FIG. 10, the primary material 29 of the support sublayer 26 and the secondary material 30 are preferably arranged alternately in substantially concentric circles with different diameters.

Figure 11A:
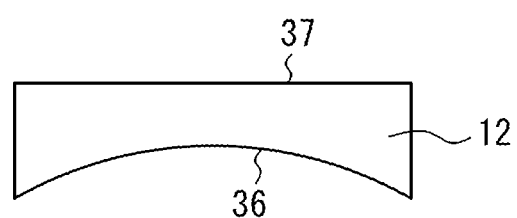
FIGS. 11A and 11B illustrate the cross-sectional shape of the image sensor according to Embodiment 2 of this disclosure.

Next, the polishing to form the second layer 19 (step S109) is described. In this embodiment, polishing only stops after continuing for a predetermined time (overpolishing) after the point at which the secondary material 30 is exposed on the surface being polished. As described above, the primary material 29 and the secondary material 30 included in the second layer 19 have different harnesses. As a result, for example when the hardness of the secondary material 30 is greater than that of the primary material 29, more of the primary material 29 is polished by overpolishing. Also, the polishing rate in the region where the primary material 29 and the secondary material 30 are arranged alternately can be controlled by adjusting the distribution of the secondary material 30 in the first direction in this region. At least a portion of the surface being polished, i.e. at least a portion of the principal surface on the back side of the image sensor 12, thus becomes concave or convex. FIG. 11A illustrates an example of the entire principal surface 36 on the back side of the image sensor 12 being concave. As described below, the shape of the principal surface 36 on the back side of the image sensor 12 is transferred to the shape of a light receiving surface 37 of the image sensor 12. The properties of the materials, the distribution of the secondary material 30 in the first direction, and the time for overpolishing are freely determined in accordance with the desired shape of the light receiving surface 37 of the image sensor 12.

Figure 11B:
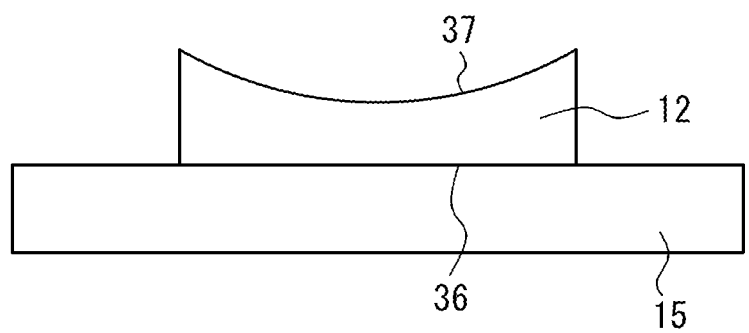

Next, the joining method during dice bonding (step S201) is described in detail. In this embodiment, the image sensor 12 is joined under suction to the package substrate 15 side at the time of dice bonding. As a result of suction, the shape of the principal surface 36 on the back side of the image sensor 12 is transferred to the shape of the light receiving surface 37 of the image sensor 12. For example, FIG. 11B illustrates an example in which the image sensor 12 illustrated in FIG. 11A, i.e. the image sensor 12 in which the entire principal surface 36 at the back side is concave, is joined under suction to the package substrate 15 side. In FIG. 11B, the shape of the principal surface 36 at the back side is transferred to the light receiving surface 37 of the image sensor 12, which becomes concave.

In this way, as in Embodiment 1, the image sensor 12 according to Embodiment 2 includes the first layer 18 and the second layer 19, in which the primary material 29 and the secondary material 30 are arranged alternately. The alternately arranged secondary material 30 functions as a heat sink to dissipate heat generated in the first layer 18 from the second layer 19 side. In this way, since the second layer 19 that includes the secondary material 30 functioning as a heat sink is joined to the heat-generating first layer 18, heat generated at the first layer 18 is conducted more efficiently to the back surface of the second layer 19, thereby improving the heat dissipation effect.

Furthermore, in the image sensor 12 according to Embodiment 2, at least a portion of the principal surface of the second layer 19 on the opposite side of the first layer 18, i.e. at least a portion of the principal surface 36 at the back side of the second layer 19, is concave or convex. This uneven shape is transferred to the shape of the light receiving surface 37 of the image sensor 12 (and to the principal surface on the front side of the first layer 18) by joining the image sensor 12 under suction to the package substrate 15. The image sensor 12 with an uneven shape is particularly suitable for imaging apparatuses with a large angle of incidence of the principal ray, such as imaging apparatuses that use a wide angle lens with a wide angle of view. For example, if the image sensor in an imaging apparatus with a wide angle lens has a flat shape, the degree of contraction of the subject differs between the central portion and peripheral portion of the image region in the image sensor. For this reason, the subject appears distorted in the peripheral portion of the captured image. By forming the image sensor 12 to have a desired uneven shape, however, the difference in the degree of contraction of the subject between the central portion and peripheral portion of the image region can be reduced. The subject therefore appears less distorted in the peripheral portion of the captured image.

Figure 8:
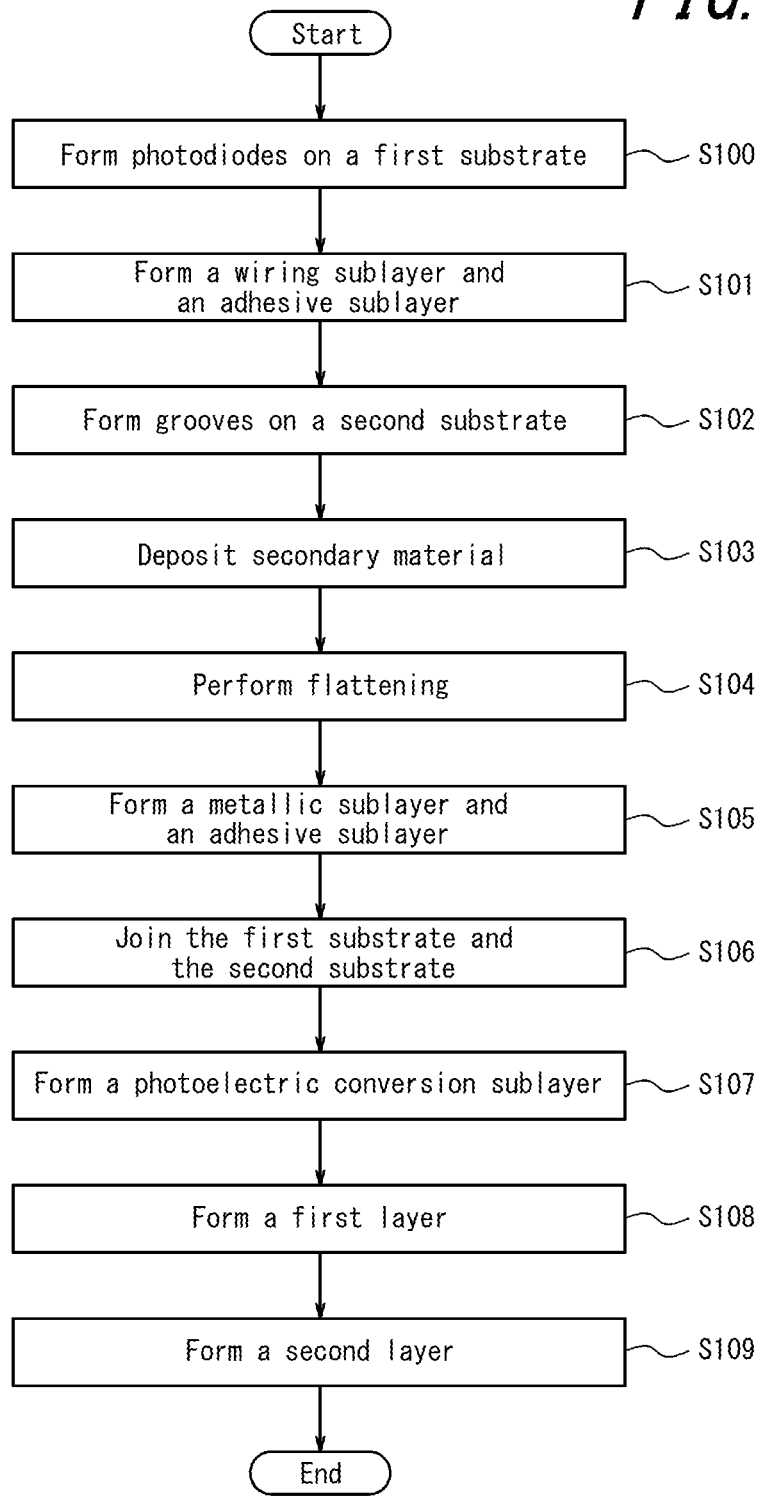
FIG. 8 is a flowchart to illustrate a pre-process in the method of manufacturing the image sensor in FIG. 1.

Furthermore, the uneven shape of the principal surface 36 on the back side of the second layer 19 is formed during a pre-process of a semiconductor process, for example by the above-described polishing in step S109 (see FIG. 8). Therefore, to obtain the desired uneven shape, an additional procedure after the polishing in step S109, i.e. an additional procedure when the image sensor 12 is relatively thin, is unnecessary. An increase in the difficulty of manufacturing the image sensor 12 is thereby prevented.

In a cross-section of the image sensor 12 along the first direction, the shape of the principal surface at the back side of the second layer 19 differs in accordance with the arrangement of the metallic material regions of the support sublayer 26. For example, when the hardness of the secondary material 30 is greater than that of the primary material 29, the polishing rate is lower as the distribution of the secondary material 30 is greater in a region. Consequently, the image sensor 12 can be provided with any curved shape by adjusting the distribution in the first direction of the secondary material 30 in the second layer 19.

Furthermore, the primary material 29 and the secondary material 30 in the second layer 19 are arranged in substantially concentric circles in the second layer 19. Consequently, distortion of a subject can be reduced uniformly at the circumferential portion of a captured image by, for example, disposing the image sensor 12 within the housing of the imaging apparatus 10 so that the center of the concentric circles is positioned on the optical axis 16 of the imaging optical system 11, and so that light passing through the imaging optical system 11, i.e. the subject image, is formed on the light receiving surface 37 of the image sensor 12.

Embodiment 3

Figure 12:
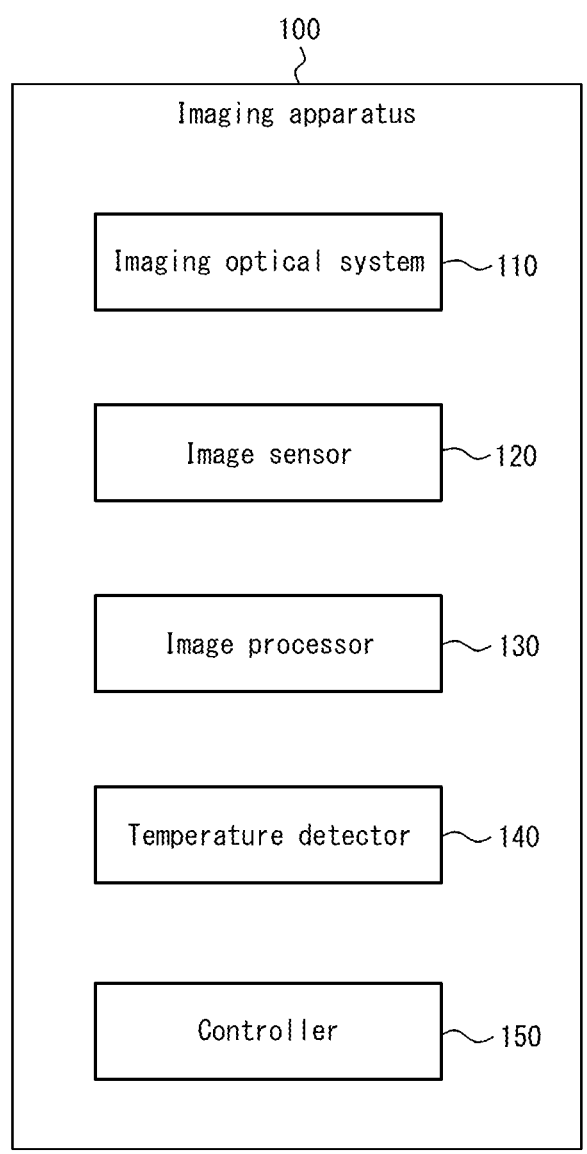
FIG. 12 is a block diagram illustrating the configuration of an imaging apparatus according to Embodiment 3 of this disclosure.

An imaging apparatus according to Embodiment 3 of this disclosure is described next. As illustrated in FIG. 12, an imaging apparatus 100 includes an imaging optical system 110, an image sensor 120, an image processor 130, a temperature detector 140, and a controller 150.

The imaging optical system 110 includes an aperture and a plurality of lenses and forms an image of a subject.

The image sensor 120 may, for example, be a CMOS image sensor and captures a subject image formed by the imaging optical system 110. The image sensor 120 also outputs the image generated by imaging to the image processor 130 as an analog image signal. In this embodiment, the image sensor 120 is described as being back-illuminated, but this example is not limiting. As described below, the image sensor 120 includes a first layer and a second layer and has a Peltier device in the second layer.

The image processor 130 includes a dedicated processor for image processing, such as an AFE or a DSP, and performs pre-image processing, such as CDS, gain adjustment (AGC), and AD conversion (ADC) on the image signal acquired from the image sensor 120. The image processor 130 also performs predetermined post-image processing, such as automatic exposure (AE), automatic white balance (AWB), color interpolation, brightness correction, color correction, and gamma correction on the captured image.

The temperature detector 140 for example includes a temperature sensor and can detect the temperature of the image sensor 120.

The controller 150 is, for example, a dedicated microprocessor or is a general-purpose CPU that executes specific processing by reading a specific program. The controller 150 controls overall operations of the imaging apparatus 100. For example, the controller 150 acquires the temperature of the image sensor 120 detected by the temperature detector 140. In accordance with the temperature of the image sensor 120, the controller 150 also controls operations of the Peltier device in the image sensor 120. For example, the controller 150 operates the Peltier device by feedback control based on the temperature detected by the temperature detector 140 to maintain the temperature of the image sensor 120 at a desired temperature.

Figure 13:
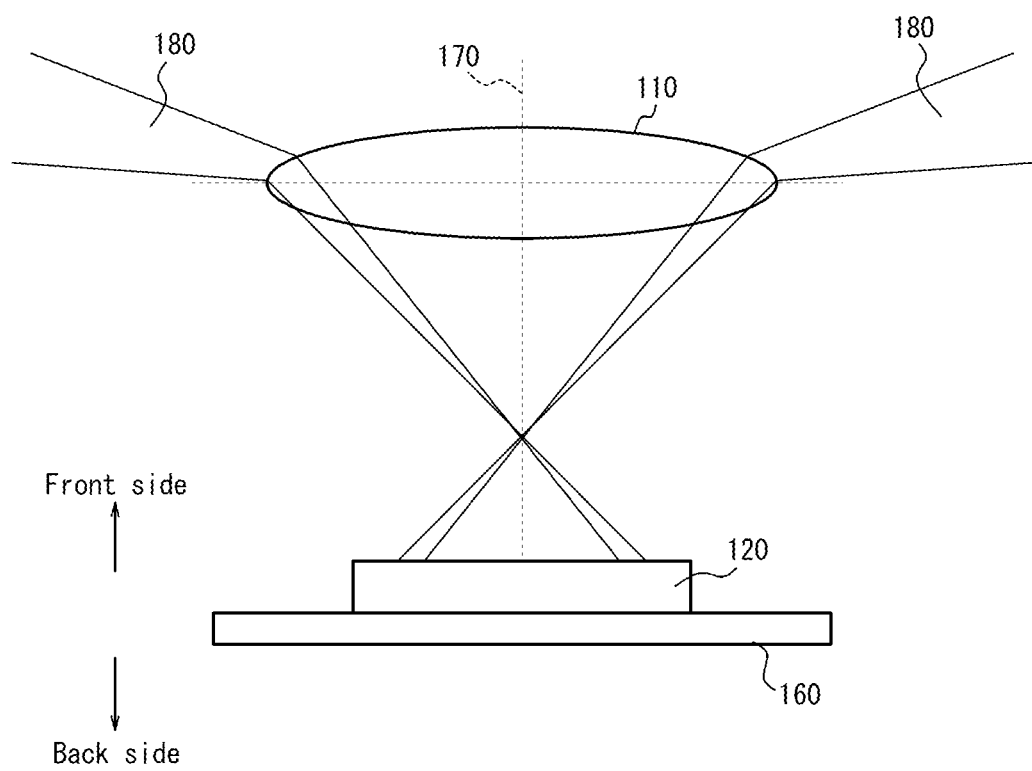
FIG. 13 illustrates the positional relationship between the image sensor and the imaging optical system in FIG. 12.

The positional relationship between the imaging optical system 110 and the image sensor 120 is described next. As illustrated in FIG. 13, the image sensor 120 joined to a package substrate 160 is disposed within a housing of the imaging apparatus 100 so that the image sensor 120 is centered on the optical axis 170 of the imaging optical system 110 and light 180 passing through the imaging optical system 110, i.e. the subject image, is formed on the light receiving surface of the image sensor 120. Hereinafter, the light receiving surface side of the image sensor 120 (the top in FIG. 13) is referred to as the front side, and the joining surface side of the package substrate 160 (the bottom in FIG. 13) is referred to as the back side.

Figure 14:
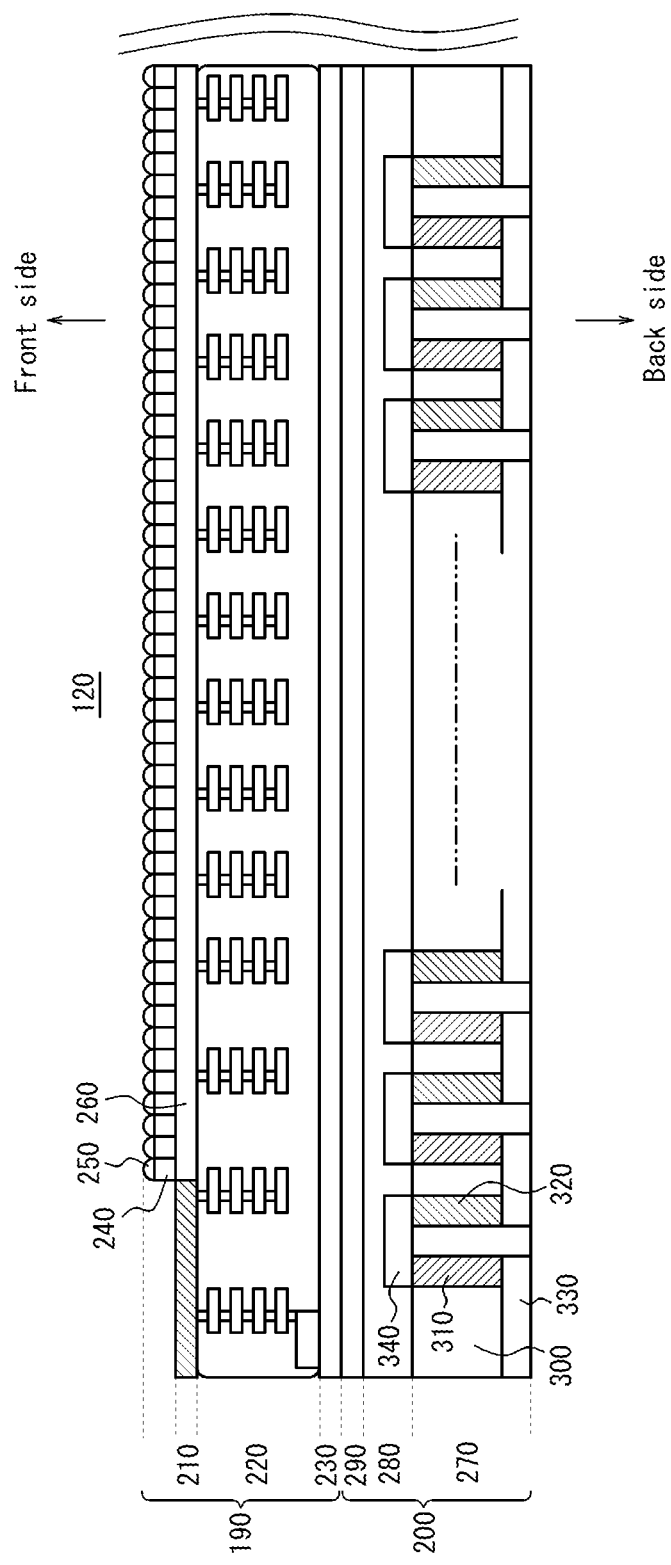
FIG. 14 is a cross-sectional diagram of the image sensor in FIG. 12.

Next, the configuration of the image sensor 120 is described in detail. As illustrated in FIG. 14, the image sensor 120 includes a first layer 190 and a second layer 200. For the sake of illustration, the constituent elements of the image sensor 120 are not to scale in FIG. 14. Furthermore, FIG. 14 is a cross-sectional diagram of the image sensor 120 in at least one direction (first direction) in which a plurality of pixels of the image sensor 120 are arranged.

The first layer 190 has an imaging function to output captured image signals from the pixels and has, for example, a thickness of approximately 3 µm to 4 µm. The first layer 190 includes a photoelectric conversion sublayer 210, a wiring sublayer 220, an adhesive sublayer 230, a color filter 240, and microlenses 250.

The photoelectric conversion sublayer 210 includes a semiconductor material, such as silicon, as a primary material. Photodiodes 260 and MOS transistors constituting pixels are formed in one region of the photoelectric conversion sublayer 210. The principal surface at the front side of the photoelectric conversion sublayer 210 is the light-receiving surface of the image sensor 120.

The wiring sublayer 220 includes an insulating material, such as silicon oxide, as a primary material. Circuits that read captured image signals from pixels are formed in one region of the wiring sublayer 220. The circuits are configured by layering wires made, for example, of copper, aluminum, or the like. The wiring sublayer 220 is provided on the back side adjacent to the photoelectric conversion sublayer 210.

The adhesive sublayer 230 is configured by a highly adhesive material, such as silicon nitride. The adhesive sublayer 230 is disposed at the back side, adjacent to the wiring sublayer 220, and is used to join the first layer 190 and the second layer 200 so that these layers are in close contact.

The color filter 240 is a filter that, for example, corresponds to each of the RGB colors and transmits light in a particular wavelength band. The color filter 240 is provided in correspondence with each pixel. The color filter 240 is provided on the front side adjacent to the photoelectric conversion sublayer 210 in the region where the photodiodes 260 of the photoelectric conversion sublayer 210 are formed.

The microlenses 250 are lenses provided in correspondence with each pixel. The microlenses 250 focus light irradiated through the imaging optical system 110 onto the light receiving surface of the image sensor 120 through the color filter 240.

The second layer 200 supports the first layer 190 and has, for example, a thickness of approximately 170 µm. As described below, via the Peltier device formed in the second layer 200, the second layer 200 actively conducts the heat generated in the first layer 190 to the second layer 200. The second layer 200 includes a support sublayer 270, an insulating sublayer 280, and an adhesive sublayer 290.

The support sublayer 270 includes silicon or glass, for example, as a primary material. In the support sublayer 270, primary material regions including primary material 300 and secondary material regions including secondary material are arranged (positioned) alternately in the first direction. First conductive type semiconductor material 310 and second conductive type semiconductor material 320, which are each a secondary material, are arranged in the secondary material regions. The properties of the materials and the distribution thereof in the width direction of the secondary material, i.e. in the first direction, are determined freely to obtain the desired heat dissipation. In the support sublayer 270, a plurality of first electrodes 330 are also arranged in the first direction. The first electrodes 330 are, for example, formed from a metallic material such as copper. Each first electrode 330 is connected to the back side of at least one of the first conductive type semiconductor material 310 and the second conductive type semiconductor material 320 and constitutes part of a circuit that connects the first conductive type semiconductor material 310 and the second conductive type semiconductor material 320 alternately in series. The first electrodes 330 preferably extend to the principal surface at the back side of the second layer 200.

The insulating sublayer 280 includes an insulating material, such as silicon oxide, as a primary material. The insulating sublayer 280 is provided at the front side adjacent to the support sublayer 270. In the insulating sublayer 280, a plurality of second electrodes 340 are arranged in the first direction. The second electrodes 340 are, for example, formed from a metallic material such as copper. Each second electrode 340 is connected to the front side of at least one of the first conductive type semiconductor material 310 and the second conductive type semiconductor material 320 and constitutes part of a circuit that connects the first conductive type semiconductor material 310 and the second conductive type semiconductor material 320 alternately in series.

In this way, the first electrodes 330, the first conductive type semiconductor material 310 and second conductive type semiconductor material 320, and the second electrodes 340 are layered in the direction from the second layer 200 towards the first layer 190 in the support sublayer 270 and the insulating sublayer 280 to form a Peltier device.

The adhesive sublayer 290 is configured by a highly adhesive material, such as silicon nitride. The adhesive sublayer 290 is disposed at the front side, adjacent to the insulating sublayer 280, and is used to join the first layer 190 and the second layer 200 so that these layers are in close contact.

Next, the procedure for forming the first layer 190 and the second layer 200 is described with reference to FIGS. 15A through 17E. An example of this procedure is described below as being divided into a procedure to process the first substrate, a procedure to process the second substrate, and a procedure to join the first substrate and the second substrate. This procedure for forming the first layer 190 and the second layer 200 is, for example, incorporated into a pre-process of a semiconductor process. The first substrate and the second substrate are described as being typical silicon semiconductor substrates, for example.

(Procedure to Process the First Substrate)

Figure 15A:
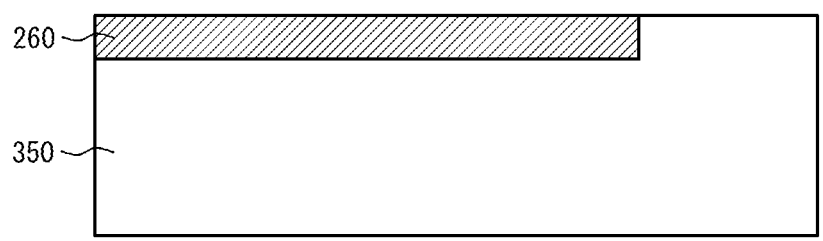
FIGS. 15A and 15B are cross-sectional diagrams of a substrate to illustrate a method of manufacturing the image sensor in FIG. 12.
Figure 15B:
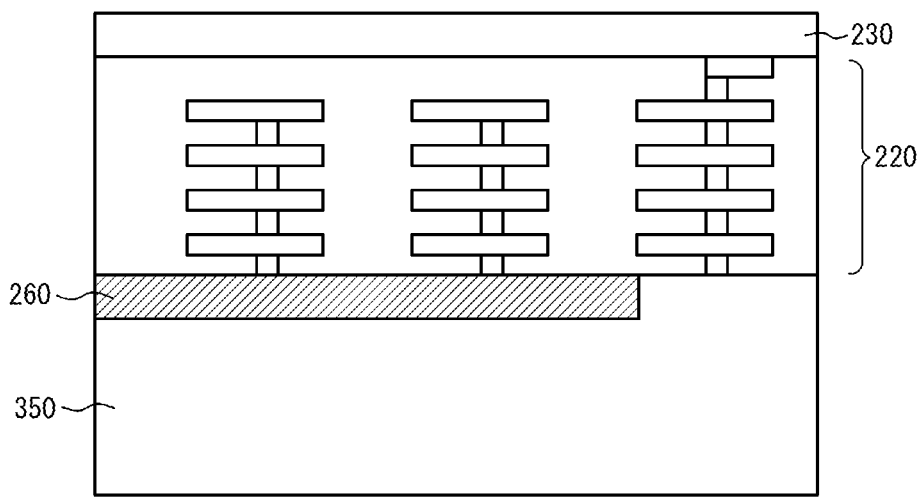

First, the procedure to process the first substrate is described. As illustrated in FIG. 15A, the photodiodes 260 and MOS transistors are first formed on a flattened, principal surface of a first substrate 350. Next, as illustrated in FIG. 15B, the wiring sublayer 220 is formed on this principal surface of the first substrate 350, and the adhesive sublayer 230 is further formed by layering a silicon nitride film, for example.

(Procedure to Process the Second Substrate)

Figure 16A:
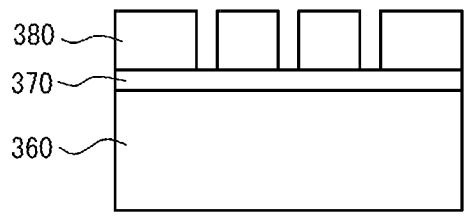
FIGS. 16A, 16B, 16C, 16D, 16E, and 16F are cross-sectional diagrams of the substrate to illustrate the method of manufacturing the image sensor in FIG. 12.
Figure 16B:
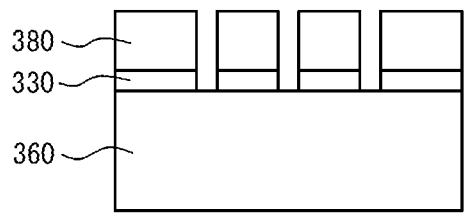
Figure 16C:
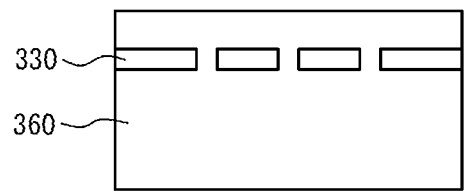
Figure 16D:
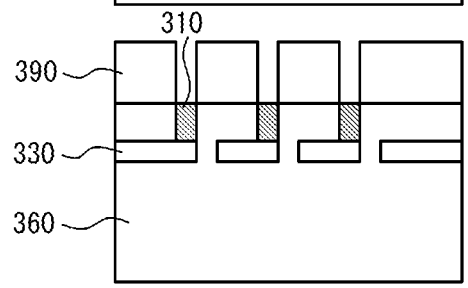
Figure 16E:
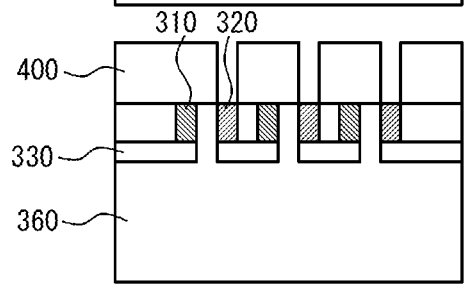
Figure 16F:
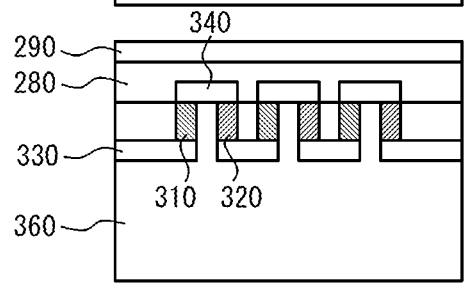

Next, the procedure to process the second substrate is described. As illustrated in FIG. 16A, a metallic film 370, such as copper, is first formed on a flattened, principal surface of a second substrate 360, a photoresist 380 is applied, and patterning is performed. Next, as illustrated in FIG. 16B, etching is performed to form the first electrodes 330 on the principal surface of the second substrate 360. Subsequently, as illustrated in FIG. 16C, the photoresist 380 is removed, and the primary material of the second substrate 360 is epitaxially grown. As illustrated in FIG. 16D, grooves are then formed in the primary surface of the epitaxially grown second substrate 360 by patterning of a photoresist 390 and etching, and the first conductive type semiconductor material 310 is layered in the grooves. As illustrated in FIG. 16E, the photoresist 390 is then removed, grooves are formed in the primary surface of the epitaxially grown second substrate 360 by patterning of a photoresist 400 and etching, and the second conductive type semiconductor material 320 is layered in the grooves. Subsequently, as illustrated in FIG. 16F, the photoresist 400 is removed, and the second electrodes 340 are formed in the same way as the first electrodes 330. The insulating sublayer 280 is then formed by, for example, layering a silicon oxide film, and the adhesive sublayer 290 is formed by, for example, layering a silicon nitride film.

(Procedure to Join the First Substrate and the Second Substrate)

Figure 17A:
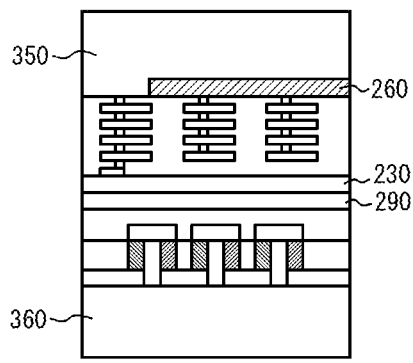
FIGS. 17A, 17B, 17C, 17D, and 17E are cross-sectional diagrams of the substrate to illustrate the method of manufacturing the image sensor in FIG. 12.
Figure 17B:
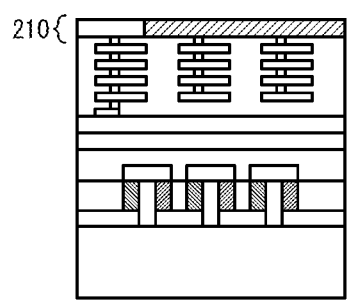
Figure 17C:
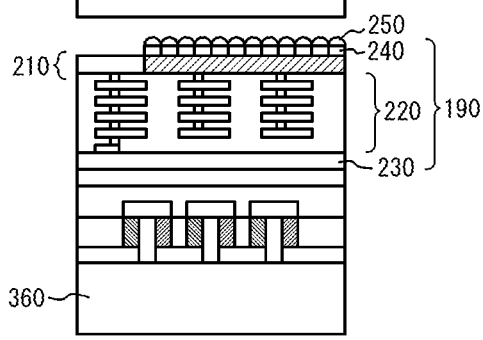
Figure 17D:
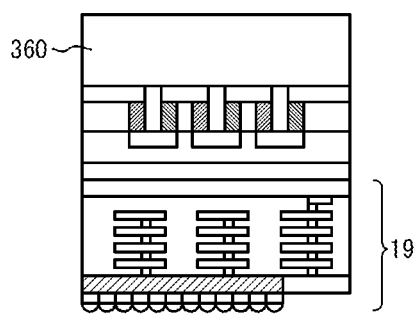
Figure 17E:
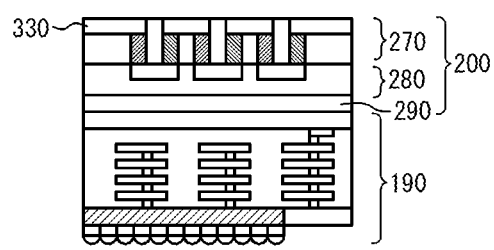

Next, the procedure to join the first substrate 350 and the second substrate 360 is described. As illustrated in FIG. 17A, the adhesive sublayer 230 of the first substrate 350 and the adhesive sublayer 290 of the second substrate 360 are first joined. Next, as illustrated in FIG. 17B, the other principal surface of the first substrate 350 is polished. The other principal surface is, for example, polished until the photodiodes 260 are exposed, thereby forming the photoelectric conversion sublayer 210. Next, as illustrated in FIG. 17C, the color filter 240 and microlenses 250 are disposed on the photoelectric conversion sublayer 210. The first layer 190 including the adhesive sublayer 230, the wiring sublayer 220, the photoelectric conversion sublayer 210, the color filter 240, and the microlenses 250 is thus formed. Subsequently, as illustrated in FIG. 17D, the second substrate 360 on which the first layer 190 is formed is turned upside down. As illustrated in FIG. 17E, the other principal surface of the second substrate 360 is then polished to form the support sublayer 270. The other principal surface is preferably polished until the first electrodes 330 are exposed, thereby forming the support sublayer 270. The second layer 200 that includes the support sublayer 270, the insulating sublayer 280, and the adhesive sublayer 290 is thus formed. An image sensor wafer that includes the first layer 190 and the second layer 200 is obtained by the above-described procedure.

Figure 18:
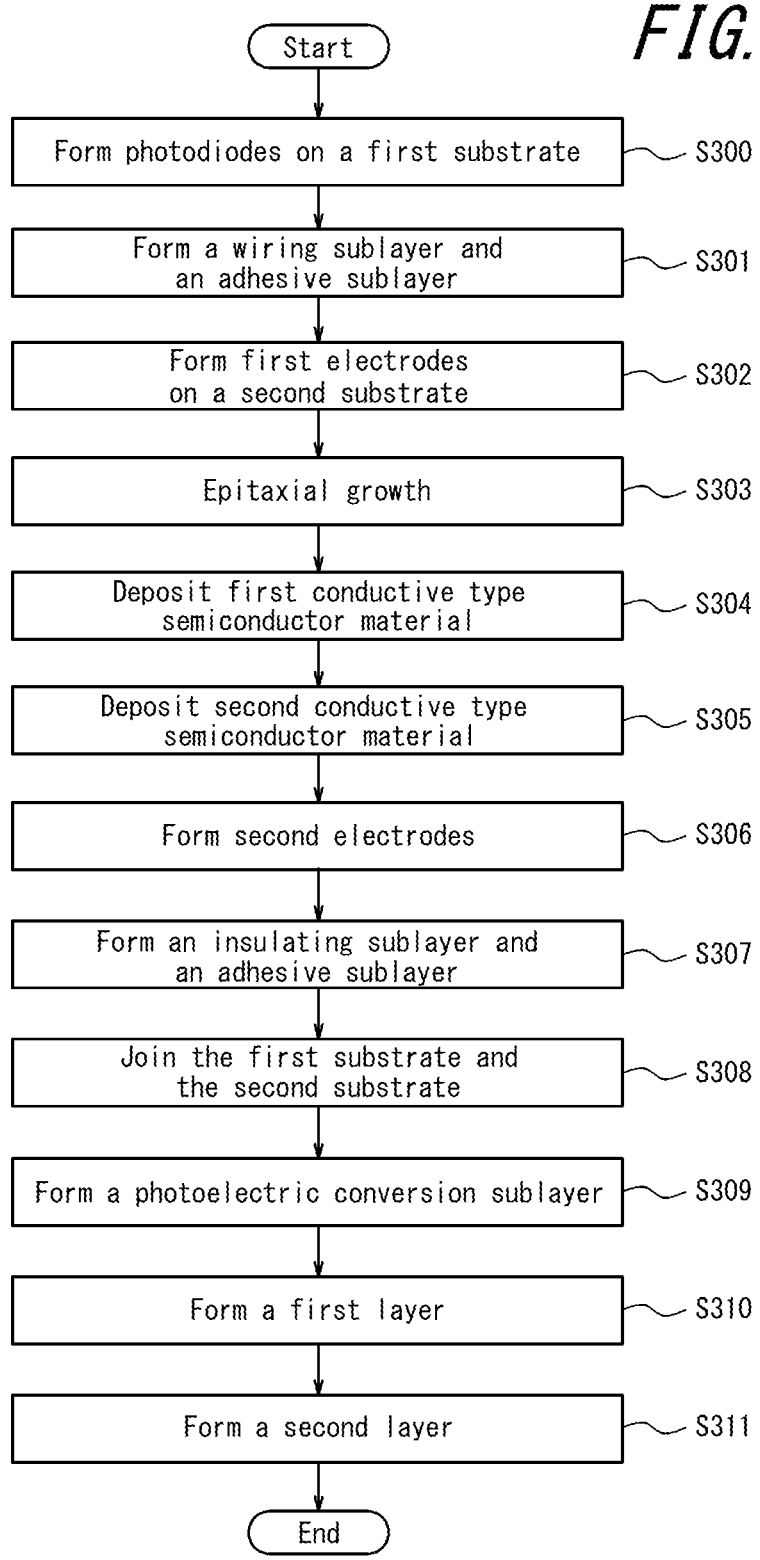
FIG. 18 is a flowchart to illustrate a pre-process in the method of manufacturing the image sensor in FIG. 12.

Next, the flow of the above-described procedure for forming the first layer 190 and the second layer 200 is described with reference to the flowchart in FIG. 18.

Step S300: First, the photodiodes 260 and MOS transistors are formed on one principle surface of the first substrate 350.

Step S301: Subsequently, the wiring sublayer 220 is formed on this principal surface of the first substrate 350, and the adhesive sublayer 230 is further formed by layering a silicon nitride film, for example.

Step S302: Next, the metallic film 370 and the pattern of the photoresist 380 are formed on a principal surface of the second substrate 360, and the first electrodes 330 are formed by etching.

Step S303: Subsequently, the photoresist 380 is removed from the second substrate 360, and the primary material of the second substrate 360 is epitaxially grown.

Step S304: Grooves are then formed in the primary surface of the epitaxially grown second substrate 360 by patterning of a photoresist 390 and etching, and the first conductive type semiconductor material 310 is layered in the grooves.

Step S305: The photoresist 390 is then removed from the second substrate 360, grooves are formed in the primary surface of the epitaxially grown second substrate 360 by patterning of a photoresist 400 and etching, and the second conductive type semiconductor material 320 is layered in the grooves.

Step S306: Next, the photoresist 400 is removed from the second substrate 360, and the second electrodes 340 are formed in the same way as the first electrodes 330.

Step S307: The insulating sublayer 280 is then formed by, for example, layering a silicon oxide film, and the adhesive sublayer 290 is formed by, for example, layering a silicon nitride film.

Step S308: Next, the adhesive sublayer 230 of the first substrate 350 and the adhesive sublayer 290 of the second substrate 360 are joined.

Step S309: Subsequently, the other principal surface of the first substrate 350, opposite the principal surface in step S300, is polished to form the photoelectric conversion sublayer 210.

Step S310: The color filter 240 and microlenses 250 are then disposed on the photoelectric conversion sublayer 210. The first layer 190 including the adhesive sublayer 230, the wiring sublayer 220, the photoelectric conversion sublayer 210, the color filter 240, and the microlenses 250 is thus formed.

Step S311: Subsequently, the other principal surface of the second substrate 360, opposite the principal surface in step S302, is polished. The other principal surface is preferably polished until the first electrodes 330 are exposed, thereby forming the support sublayer 270. The second layer 200 that includes the support sublayer 270, the insulating sublayer 280, and the adhesive sublayer 290 is thus formed.

Figure 19:
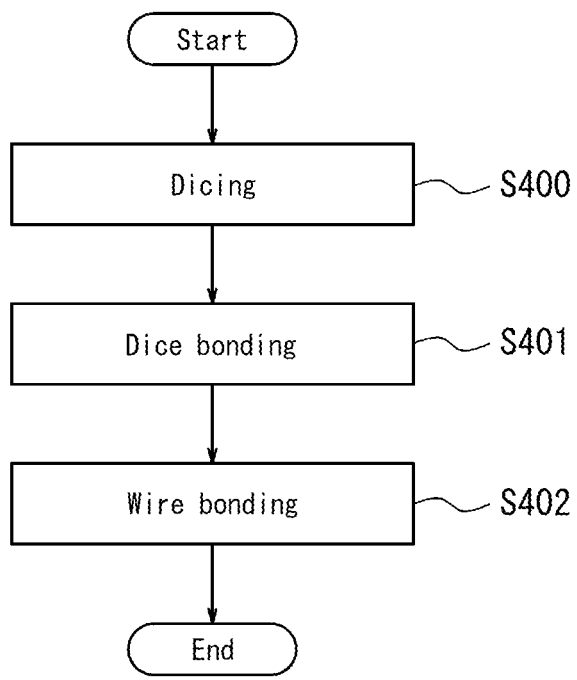
FIG. 19 is a flowchart to illustrate a post-process in the method of manufacturing the image sensor in FIG. 12.

Next, the flow of the procedure to process the image sensor wafer in which the first layer 190 and the second layer 200 are formed is described with reference to the flowchart in FIG. 19. This procedure is, for example, incorporated into a post-process of a semiconductor process.

Step S400: First, the image sensor wafer is cut into the desired chip size by dicing.

Step S401: Subsequently, the image sensor 120, which was cut into the desired chip size, is joined to a package substrate 160 by dice bonding. For example, the image sensor 120 is joined to the lead frame of the package substrate 160 by adhesion.

Step S402: Wire bonding is then performed to connect the pad of the image sensor 120 to the pad of the package substrate 160.

In this way, the image sensor 120 according to Embodiment 3 includes the first layer 190 and the second layer 200, which includes the support sublayer 270 in which the primary material regions and the secondary material regions are arranged alternately. Furthermore, the first conductive type semiconductor material 310 and second conductive type semiconductor material 320 are arranged in the secondary material regions. The first electrodes 330, the first conductive type semiconductor material 310 and second conductive type semiconductor material 320, and the second electrodes 340 are also layered in the direction from the second layer 200 towards the first layer 190 to form a Peltier device. In this way, since the second layer 200 in which a Peltier device is formed is joined to the heat-generating first layer 190, heat generated at the first layer 190 is actively conducted to the back surface of the second layer 200, thereby improving the heat dissipation effect. Furthermore, the second layer 200 can, for example, be formed by the polishing in the above-described step S311 during a pre-process of a semiconductor process. Therefore, to form the second layer 200 that includes a Peltier device, an additional procedure after the polishing in step S311, i.e. an additional procedure when the image sensor 120 is relatively thin, is unnecessary. An increase in the difficulty of manufacturing the image sensor 120 is thereby prevented.

The first electrodes 330 at the back side of the Peltier device extend to the principal surface of the second layer 200 on the opposite side of the first layer 190, i.e. to the principal surface at the back side of the second layer 200. In this way, for example upon joining the image sensor 120 to the package substrate 160, the first electrodes 330 arranged in the second layer 200 and the package substrate 160 come into contact, further improving the heat dissipation effect.

The image sensor 120 is a back-illuminated image sensor. Typically, a back-illuminated image sensor is manufactured by joining a support substrate to a substrate on which photodiodes, a wiring layer, and the like are formed. The support substrate can therefore be used as the second substrate 360 according to this embodiment, preventing an increase in costs and allowing a reduction in thickness of the image sensor 120.

The imaging apparatus 100 according to an embodiment includes the image sensor 120 with the Peltier device formed therein, the temperature detector 140 that detects the temperature of the image sensor 120, and the controller 150 that controls operations of the Peltier device in accordance with the detected temperature. In this way, the Peltier device can be operated so as to maintain the temperature of the image sensor 120 at a desired temperature, thereby improving the heat dissipation effect.

A method of manufacturing the image sensor 120 according to an embodiment forms the photodiodes 260 on one principal surface of the first substrate 350, forms a Peltier device by layering the first electrodes 330, the first conductive type semiconductor material 310 and the second conductive type semiconductor material 320, and the second electrodes 340 on one principal surface of the second substrate 360, joins the first substrate 350 and the second substrate 360, subsequently polishes the other principal surface of the first substrate 350 to form the photoelectric conversion sublayer 210, and polishes the other principal surface of the second substrate 360 to form the support sublayer 270. During the polishing to form the support sublayer 270, the endpoint of polishing can be determined with reference to the position of the first electrodes 330 formed on the second substrate 360, thereby improving the film thickness controllability.

Embodiment 4

Figure 20:
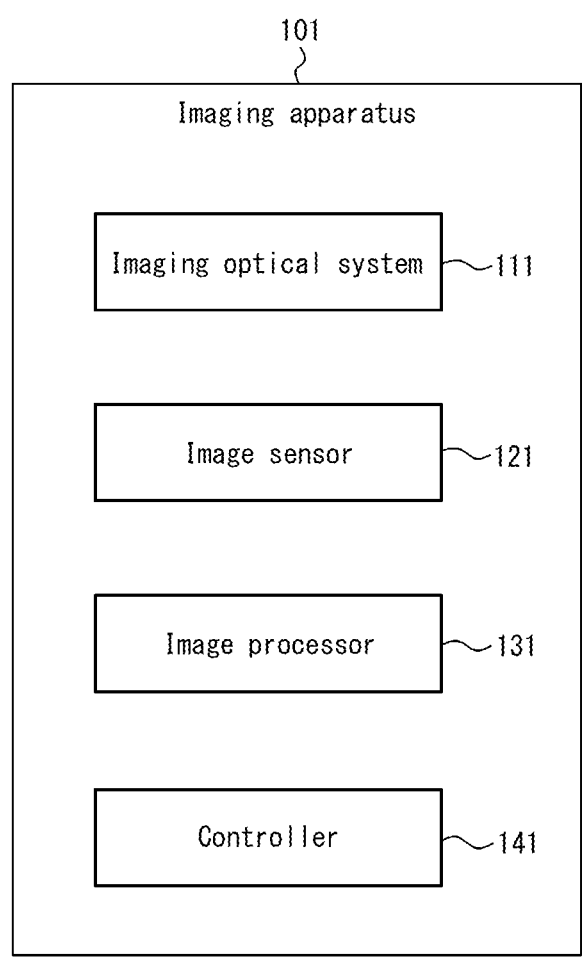
FIG. 20 is a block diagram illustrating the configuration of an imaging apparatus according to Embodiment 4 of this disclosure.

An imaging apparatus according to Embodiment 4 of this disclosure is described next. As illustrated in FIG. 20, an imaging apparatus 101 includes an imaging optical system 111, an image sensor 121, an image processor 131, and a controller 141.

The imaging optical system 111 includes an aperture and a plurality of lenses and forms an image of a subject. In this embodiment, the imaging optical system 111 has a wide angle of view and can, for example, focus principal rays with an angle of incidence of 90° or greater.

The image sensor 121 may, for example, be a CMOS image sensor and captures a subject image formed by the imaging optical system 111. The image sensor 121 also outputs the image generated by imaging to the image processor 131 as an analog image signal. In this embodiment, the image sensor 121 is described as being back-illuminated, but this example is not limiting.

The image processor 131 includes a dedicated processor for image processing, such as an AFE or a DSP, and performs pre-image processing, such as CDS, gain adjustment (AGC), and AD conversion (ADC) on the image signal acquired from the image sensor 121. The image processor 131 also performs predetermined post-image processing, such as automatic exposure (AE), automatic white balance (AWB), color interpolation, brightness correction, color correction, and gamma correction on the captured image.

The controller 141 is, for example, a dedicated microprocessor or is a general-purpose CPU that executes specific processing by reading a specific program. The controller 141 controls overall operations of the imaging apparatus 101.

Figure 21:
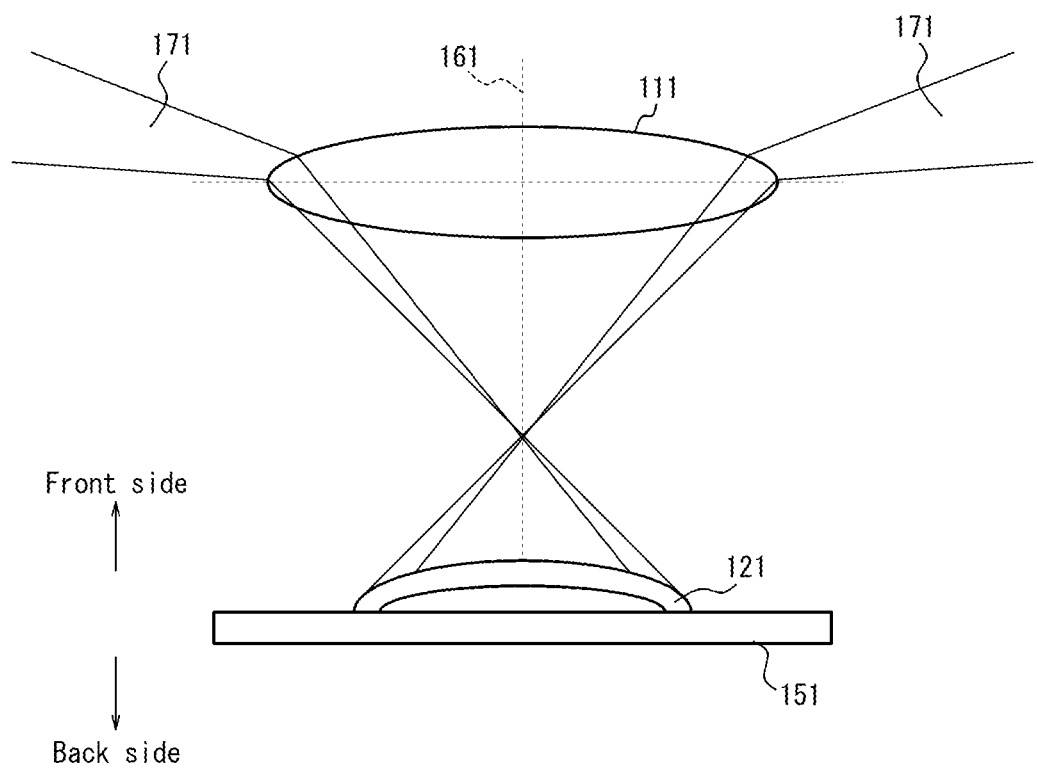
FIG. 21 illustrates the positional relationship between the image sensor and the imaging optical system in FIG. 20.

The positional relationship between the imaging optical system 111 and the image sensor 121 is described next. As illustrated in FIG. 21, the image sensor 121 joined to a package substrate 151 is disposed within a housing of the imaging apparatus 101 so that the image sensor 121 is centered on the optical axis 161 of the imaging optical system 111 and light 171 passing through the imaging optical system 111, i.e. the subject image, is formed on the light receiving surface of the image sensor 121. As described below, the image sensor 121 deforms to adopt a curved shape as a result of the secondary material included in the second layer provided in the image sensor 121 expanding or contracting, or as a result of tensile stress or compressive stress generated in the secondary material. At least a portion of the light receiving surface of the image sensor 121 thus becomes concave or convex. FIG. 21 illustrates an example of the entire image sensor 121 (and the light receiving surface) being convex. Hereinafter, the light receiving surface side of the image sensor 121 (the top in FIG. 21) is referred to as the front side, and the joining surface side of the package substrate 151 (the bottom in FIG. 21) is referred to as the back side.

Figure 22:
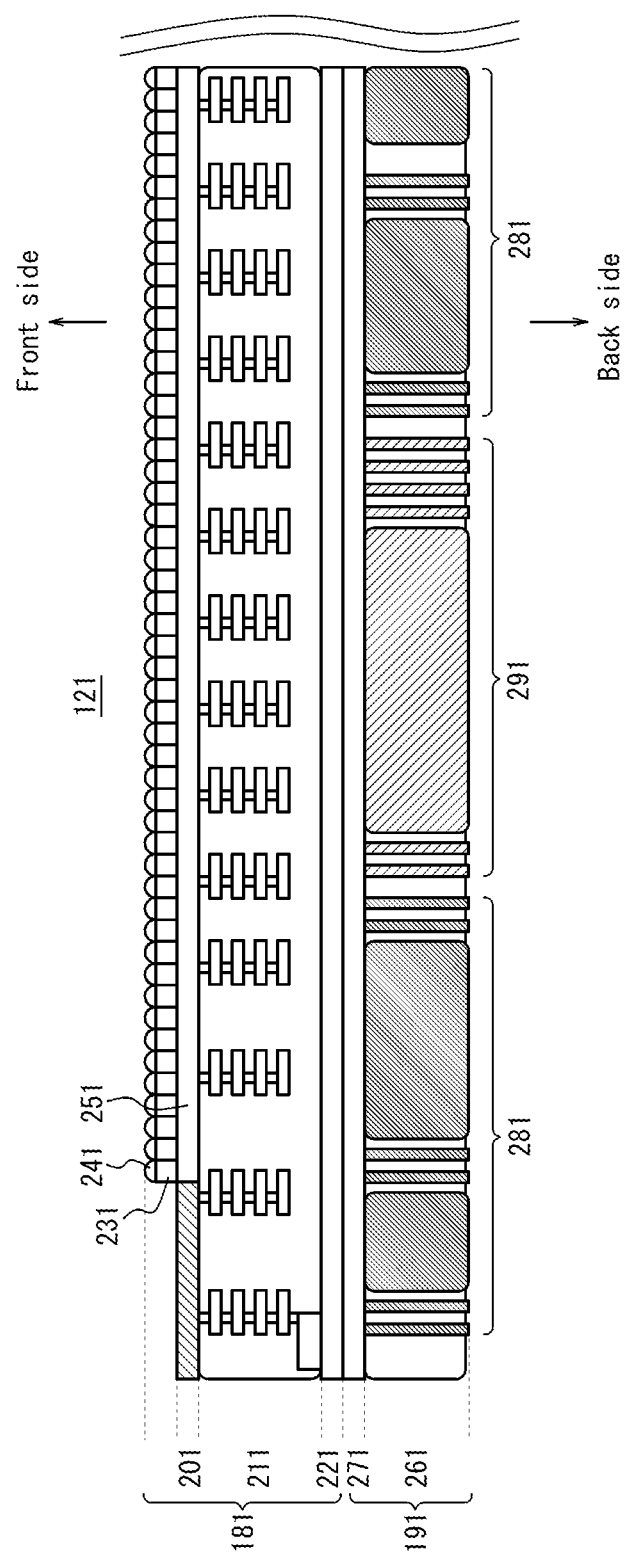
FIG. 22 is a cross-sectional diagram of the image sensor in FIG. 20.

Next, the configuration of the image sensor 121 is described in detail. As illustrated in FIG. 22, the image sensor 121 includes a first layer 181 and a second layer 191. For the sake of illustration, the image sensor 121 is illustrated without being curved, and the constituent elements of the image sensor 121 are not to scale in FIG. 22. Furthermore, FIG. 22 is a cross-sectional diagram of the image sensor 121 in at least one direction (first direction) in which a plurality of pixels of the image sensor 121 are arranged.

The first layer 181 has an imaging function to output captured image signals from the pixels and has, for example, a thickness of approximately 3 μm to 4 μm. The first layer 181 includes a photoelectric conversion sublayer 201, a wiring sublayer 211, an adhesive sublayer 221, a color filter 231, and microlenses 241.

The photoelectric conversion sublayer 201 includes a semiconductor material, such as silicon, as a primary material. Photodiodes 251 and MOS transistors constituting pixels are formed in one region of the photoelectric conversion sublayer 201. The principal surface at the front side of the photoelectric conversion sublayer 201 is the light-receiving surface of the image sensor 121.

The wiring sublayer 211 includes an insulating material, such as silicon oxide, as a primary material. Circuits that read captured image signals from pixels are formed in one region of the wiring sublayer 211. The circuits are configured by layering wires made, for example, of copper, aluminum, or the like. The wiring sublayer 211 is provided on the back side adjacent to the photoelectric conversion sublayer 201.

The adhesive sublayer 221 is configured by a highly adhesive material, such as silicon nitride. The adhesive sublayer 221 is disposed at the back side, adjacent to the wiring sublayer 211, and is used to join the first layer 181 and the second layer 191 so that these layers are in close contact.

The color filter 231 is a filter that, for example, corresponds to each of the RGB colors and transmits light in a particular wavelength band. The color filter 231 is provided in correspondence with each pixel. The color filter 231 is provided on the front side adjacent to the photoelectric conversion sublayer 201 in the region where the photodiodes 251 of the photoelectric conversion sublayer 201 are formed.

The microlenses 241 are lenses provided in correspondence with each pixel. The microlenses 241 focus light irradiated through the imaging optical system 111 onto the light receiving surface of the image sensor 121 through the color filter 231.

The second layer 191 supports the first layer 181 and has, for example, a thickness of approximately 170 μm. The second layer 191 includes a support sublayer 261 and an adhesive sublayer 271.

Figure 23:
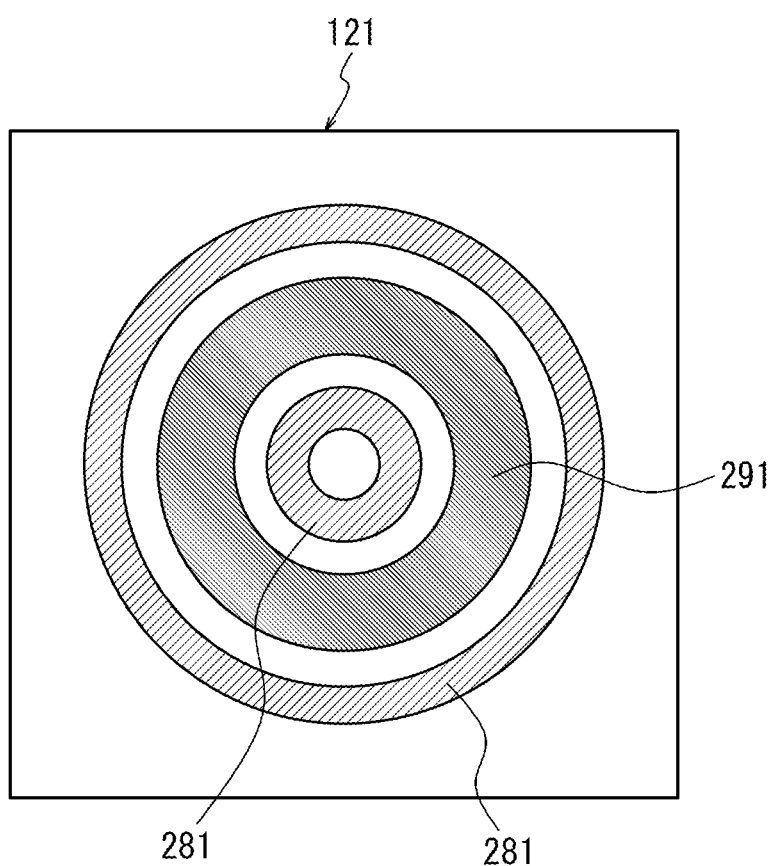
FIG. 23 is a bottom view of the image sensor in FIG. 20.

The support sublayer 261 includes silicon or glass, for example, as a primary material. Primary material and secondary material are arranged alternately in the first direction in the support sublayer 261. The properties of the materials and the distribution thereof in the width direction of the secondary material, i.e. in the first direction, are determined freely in accordance with the desired shape of the light receiving surface of the image sensor 121. In this embodiment, primary material regions that include the primary material (for example, silicon) are arranged alternately with secondary material regions that include at least one of first material 281 and second material 291, which are secondary material. The secondary material is, for example, material with a different coefficient of thermal expansion from the primary material. The first material 281 is, for example, a contractile film or a tensile stress film. The second material 291 is, for example, an expansion film or a compressive stress film. The contractile film and expansion film respectively contract and expand as a result of thermal treatment or of heat generated during a semiconductor process, for example. When viewing the second layer 191 from the back side, for example as illustrated in FIG. 23, the primary material of the support sublayer 261, the first material 281, and the second material 291 are preferably arranged alternately in substantially concentric circles with different diameters.

The adhesive sublayer 271 is configured by a highly adhesive material, such as silicon nitride. The adhesive sublayer 271 is disposed at the front side, adjacent to the support sublayer 261, and is used to join the first layer 181 and the second layer 191 so that these layers are in close contact.

Next, the procedure for forming the first layer 181 and the second layer 191 is described with reference to FIGS. 24A through 26E. This procedure is performed using two substrates (first substrate and second substrate). An example of this procedure is described below as being divided into a procedure to process the first substrate, a procedure to process the second substrate, and a procedure to join the first substrate and the second substrate. This procedure for forming the first layer 181 and the second layer 191 is, for example, incorporated into a pre-process of a semiconductor process. The first substrate and the second substrate are described as being typical silicon semiconductor substrates, for example.

(Procedure to Process the First Substrate)

Figure 24A:
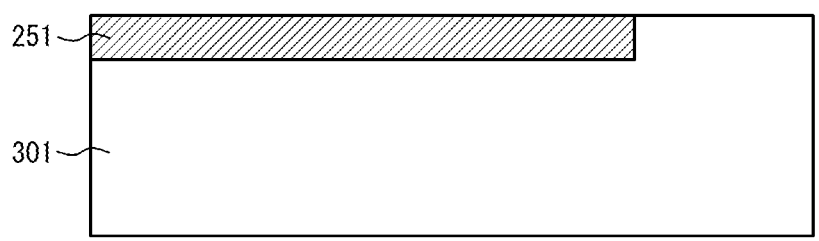
FIGS. 24A and 24B are cross-sectional diagrams of a substrate to illustrate a method of manufacturing the image sensor in FIG. 20.
Figure 24B:
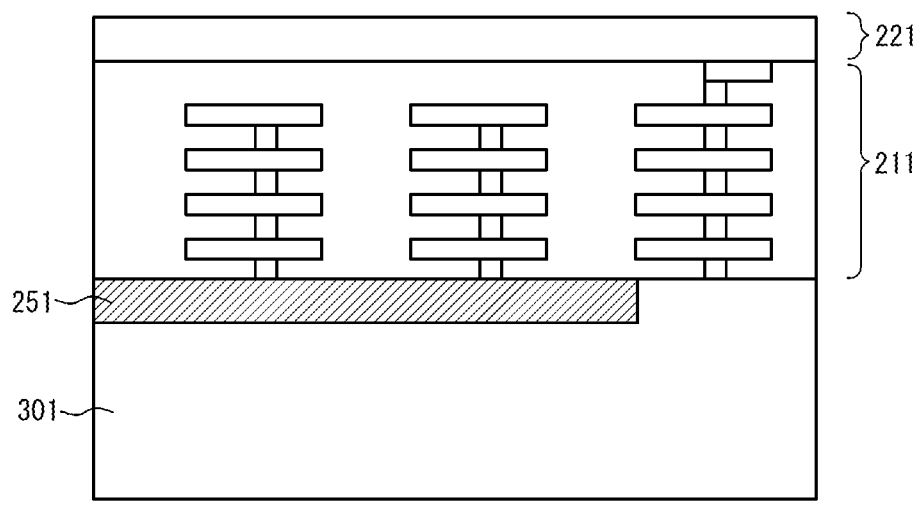

First, the procedure to process the first substrate is described. As illustrated in FIG. 24A, the photodiodes 251 and MOS transistors are first formed on a flattened, principal surface of a first substrate 301. Next, as illustrated in FIG. 24B, the wiring sublayer 211 is formed on this principal surface of the first substrate 301, and the adhesive sublayer 221 is further formed by layering a silicon nitride film, for example.

(Procedure to Process the Second Substrate)

Figure 25A:
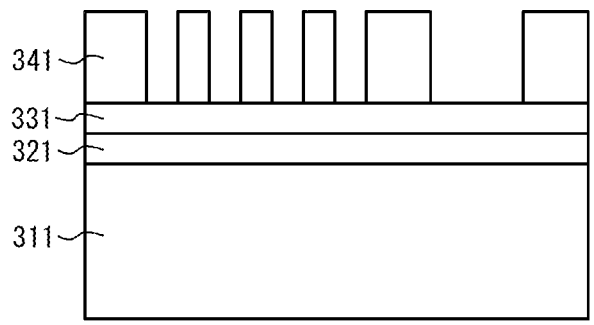
FIGS. 25A, 25B, 25C, 25D, and 25E are cross-sectional diagrams of the substrate to illustrate the method of manufacturing the image sensor in FIG. 20.
Figure 25B:
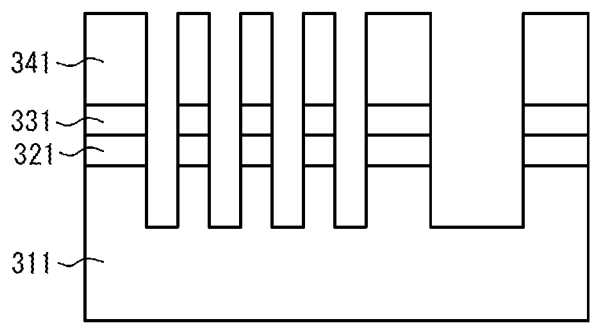
Figure 25C:
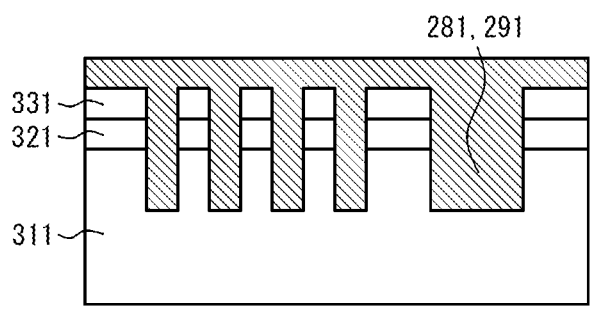
Figure 25D:
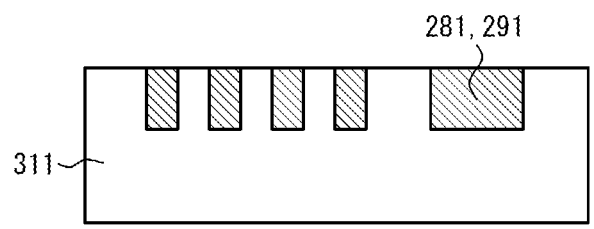
Figure 25E:
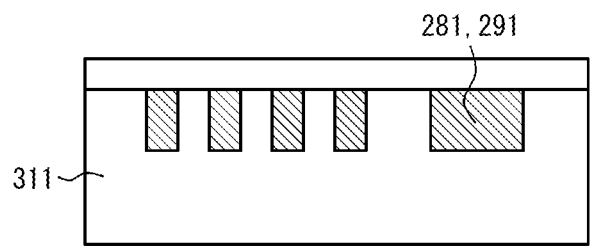

Next, the procedure to process the second substrate is described. As illustrated in FIG. 25A, a silicon oxide film 321 and a silicon nitride film 331 are first formed on a flattened, principal surface of a second substrate 311, a photoresist 341 is applied, and patterning is performed. The hardened photoresist 341 has, for example, a pattern of substantially concentric circles with different diameters. Next, as illustrated in FIG. 25B, etching is performed to form grooves in the principal surface of the second substrate 311. As illustrated in FIG. 25C, the photoresist 341 is then removed, and at least one of the first material 281 and the second material 291, which are secondary material, is deposited by any treatment, such as vapor deposition or plating. In the case of depositing two or more secondary materials, the above-described patterning, etching, and treatment to deposit secondary material are performed for each secondary material. Subsequently, as illustrated in FIG. 25D, flattening is performed and the silicon oxide film 321 and silicon nitride film 331 are removed. As illustrated in FIG. 25E, a silicon nitride film, for example, is then deposited to form the adhesive sublayer 271.

(Procedure to Join the First Substrate and the Second Substrate)

Figure 26A:
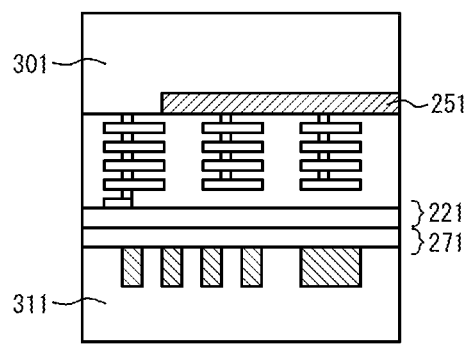
FIGS. 26A, 26B, 26C, 26D, and 26E are cross-sectional diagrams of the substrate to illustrate the method of manufacturing the image sensor in FIG. 20.
Figure 26B:
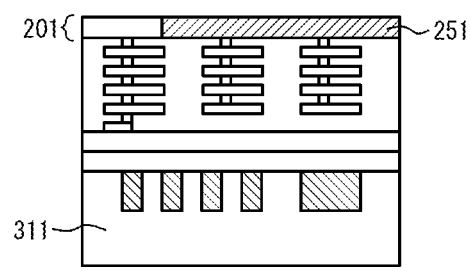
Figure 26C:
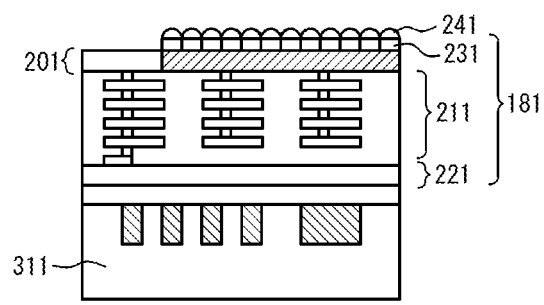
Figure 26D:
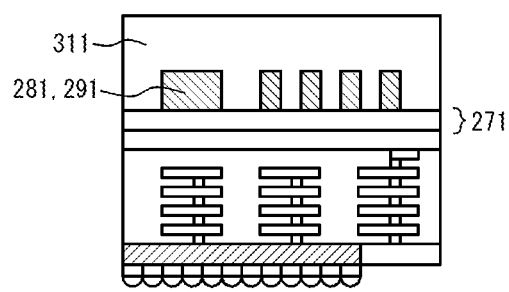
Figure 26E:
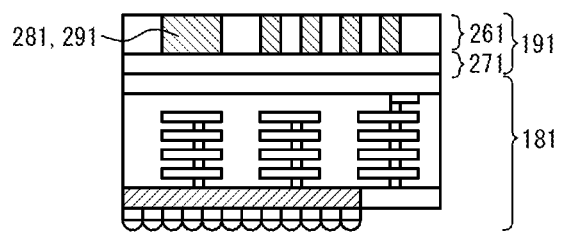

Next, the procedure to join the first substrate 301 and the second substrate 311 is described. As illustrated in FIG. 26A, the adhesive sublayer 221 of the first substrate 301 and the adhesive sublayer 271 of the second substrate 311 are first joined. Next, as illustrated in FIG. 26B, the other principal surface of the first substrate 301 is polished. The other principal surface is, for example, polished until the photodiodes 251 are exposed, thereby forming the photoelectric conversion sublayer 201. Next, as illustrated in FIG. 26C, the color filter 231 and microlenses 241 are disposed on the photoelectric conversion sublayer 201. The first layer 181 including the adhesive sublayer 221, the wiring sublayer 211, the photoelectric conversion sublayer 201, the color filter 231, and the microlenses 241 is thus formed. Subsequently, as illustrated in FIG. 26D, the second substrate 311 on which the first layer 181 is formed is turned upside down. As illustrated in FIG. 26E, the other principal surface of the second substrate 311 is then polished. The other principal surface is, for example, polished until the first material 281 or the second material 291 is exposed, thereby forming the support sublayer 261. The second layer 191 that includes the support sublayer 261 and the adhesive sublayer 271 is thus formed. An image sensor wafer that includes the first layer 181 and the second layer 191 is obtained by the above-described procedure.

Figure 27:
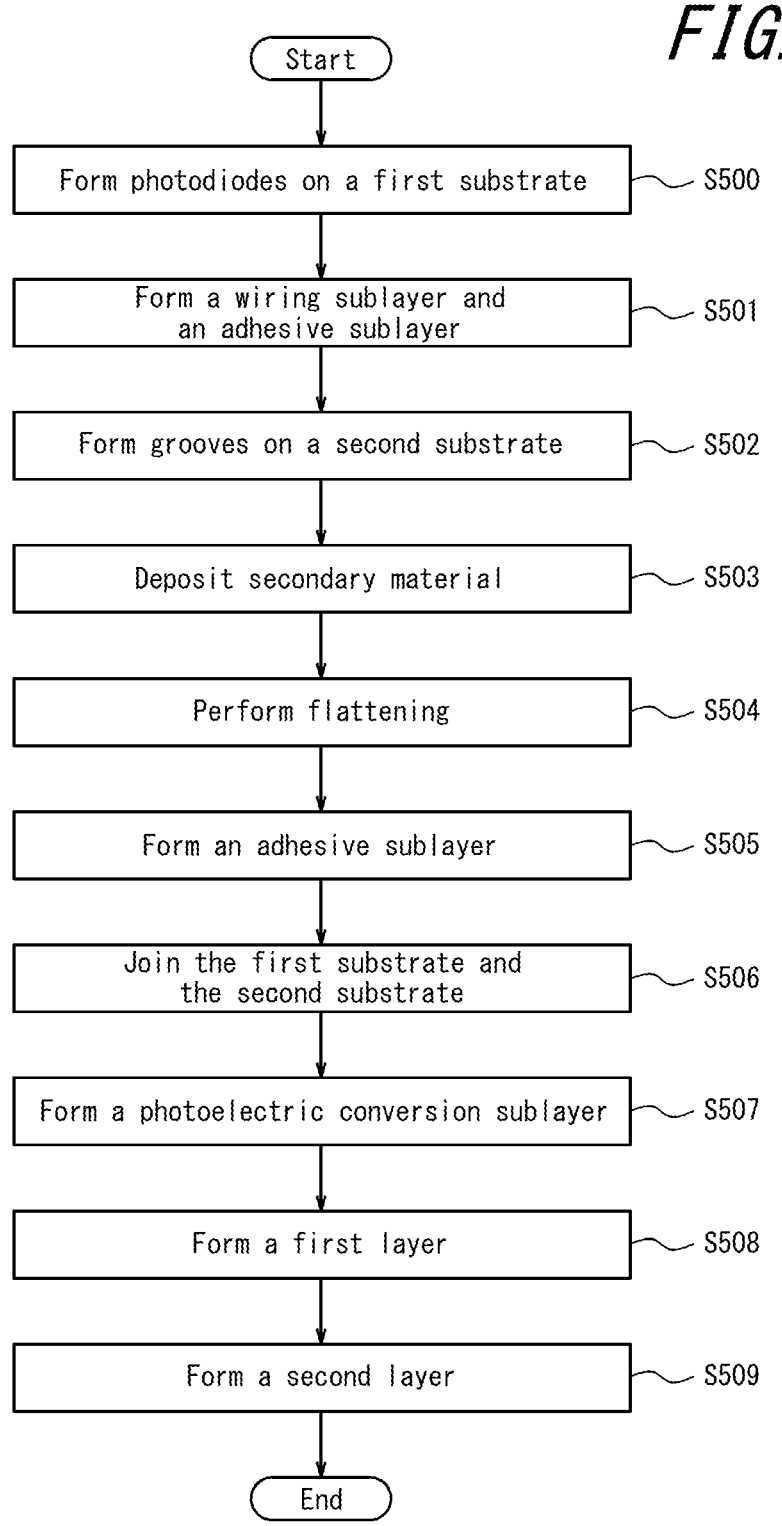
FIG. 27 is a flowchart to illustrate a pre-process in the method of manufacturing the image sensor in FIG. 20.

Next, the flow of the above-described procedure for forming the first layer 181 and the second layer 191 is described with reference to the flowchart in FIG. 27.

Step S500: First, the photodiodes 251 and MOS transistors are formed on one principle surface of the first substrate 301.

Step S501: Subsequently, the wiring sublayer 211 is formed on this principal surface of the first substrate 301, and the adhesive sublayer 221 is further formed by layering a silicon nitride film, for example.

Step S502: Next, the silicon oxide film 321, the silicon nitride film 331, and the pattern of the photoresist 341 are formed on a principal surface of the second substrate 311, and grooves are formed in the principal surface of the second substrate 311 by etching.

Step S503: Subsequently, the photoresist 341 of the second substrate 311 is removed, and at least one of the first material 281 and the second material 291 is deposited as the secondary material.

Step S504: Subsequently, the second substrate 311 is subjected to flattening to remove the silicon oxide film 321 and the silicon nitride film 331.

Step S505: Subsequently, the adhesive sublayer 271 is formed by layering a silicon nitride film, for example, on the second substrate 311.

Step S506: Next, the adhesive sublayer 221 of the first substrate 301 and the adhesive sublayer 271 of the second substrate 311 are joined.

Step S507: Subsequently, the other principal surface of the first substrate 301, opposite the principal surface in step S500, is polished to form the photoelectric conversion sublayer 201.

Step S508: The color filter 231 and microlenses 241 are then disposed on the photoelectric conversion sublayer 201. The first layer 181 including the adhesive sublayer 221, the wiring sublayer 211, the photoelectric conversion sublayer 201, the color filter 231, and the microlenses 241 is thus formed.

Step S509: Subsequently, the other principal surface of the second substrate 311, opposite the principal surface in step S502, is polished. In this embodiment, the other principal surface is polished until the secondary material is exposed, for example, thereby forming the support sublayer 261. The second layer 191 that includes the adhesive sublayer 271 and the support sublayer 261 is thus formed.

Figure 28:
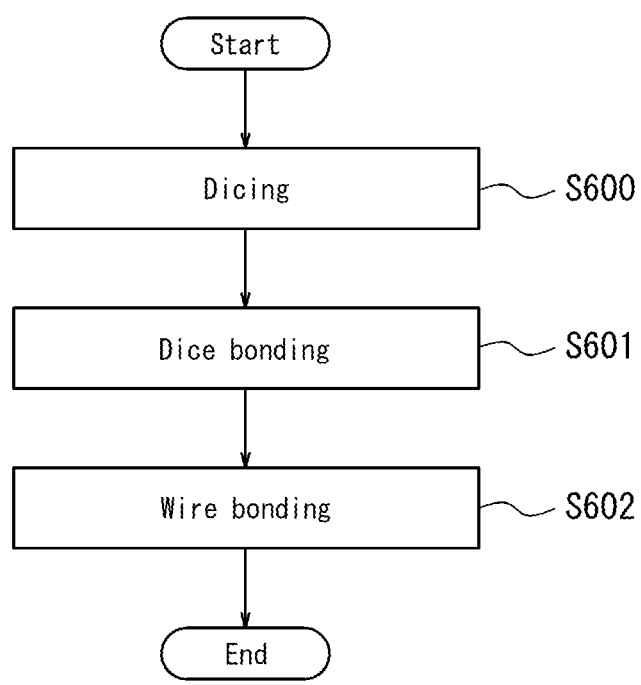
FIG. 28 is a flowchart to illustrate a post-process in the method of manufacturing the image sensor in FIG. 20.

Next, the flow of the procedure to process the image sensor wafer in which the first layer 181 and the second layer 191 are formed is described with reference to the flowchart in FIG. 28. This procedure is, for example, incorporated into a post-process of a semiconductor process.

Step S600: First, the image sensor wafer is cut into the desired chip size by dicing.

Step S601: Subsequently, the image sensor 121, which was cut into the desired chip size, is joined to a package substrate 151 by dice bonding. For example, the image sensor 121 is joined to the lead frame of the package substrate 151 by adhesion. In this embodiment, the image sensor 121 is joined to the package substrate 151 while maintaining the uneven shape of the image sensor 121.

Step S602: Wire bonding is then performed to connect the pad of the image sensor 121 to the pad of the package substrate 151.

In this way, the image sensor 121 according to Embodiment 4 includes the first layer 181 and the second layer 191, in which the primary material and the secondary material are arranged alternately. Also, at least a portion of the principal surface of the first layer 181 on the opposite side of the second layer 191, i.e. at least a portion of the principal surface at the front side of the first layer 181, is concave or convex. Here, the second layer 191 that contributes to forming the uneven shape can, for example, be formed by the polishing in the above-described step S509 (see FIG. 27) during a pre-process of a semiconductor process. Therefore, to obtain the desired uneven shape, an additional procedure after the polishing in step S509, i.e. an additional procedure when the image sensor 121 is relatively thin, is unnecessary. Consequently, an increase in the difficulty of manufacturing the image sensor 121 is prevented as compared to a configuration that, for example, requires the connections of the microlenses to have a Fresnel shape corresponding accurately to each pixel of the image sensor.

Furthermore, the image sensor 121 with an uneven shape is particularly suitable for imaging apparatuses with a large angle of incidence of the principal ray, such as imaging apparatuses that use a wide angle lens with a wide angle of view. For example, if the image sensor 121 in an imaging apparatus with a wide angle lens has a flat shape, the degree of contraction of the subject differs between the central portion and peripheral portion of the image region in the image sensor 121. For this reason, the subject appears distorted in the peripheral portion of the captured image. By forming the image sensor 121 to have a desired uneven shape, however, the difference in the degree of contraction of the subject between the central portion and peripheral portion of the image region can be reduced. The subject therefore appears less distorted in the peripheral portion of the captured image.

The secondary material included in the second layer 191 expands or contracts after formation of the second layer 191, for example after the polishing in step S509. Accordingly, during a pre-process of a semiconductor process, after depositing the secondary material and before forming the second layer 191, the secondary material either expands or contracts, thereby preventing the substrate from becoming curved. Hence, an increase in the difficulty of manufacturing during the pre-process is prevented.

The image sensor 121 is a back-illuminated image sensor. Typically, a back-illuminated image sensor is manufactured by joining a support substrate to a substrate on which photodiodes, a wiring layer, and the like are formed. The support substrate can therefore be used as the second substrate 311 according to this embodiment, preventing an increase in costs and allowing a reduction in thickness of the image sensor.

In the image sensor 121, the principal surface at the front side of the first layer 181 differs in shape in accordance with the distribution, in the first direction, of the secondary material in the second layer 191. For example, in the case of the secondary material being the first material 281 (a contractile film or a tensile stress film), the principal surface at the front side of the first layer 181 is more convex in a region as the distribution of the secondary material is greater. Alternatively, in the case of the secondary material being the first material 281 (a contractile film or a tensile stress film), the principal surface at the front side of the first layer 181 may be more concave in a region as the distribution of the secondary material is greater. Consequently, the image sensor 121 can be provided with any curved shape by adjusting the distribution in the first direction of the secondary material in the second layer 191.

Furthermore, the primary material and the secondary material in the second layer 191 are arranged in substantially concentric circles in the second layer 191. Consequently, distortion of a subject can be reduced uniformly at the circumferential portion of a captured image by, for example, disposing the image sensor 121 within the housing of the imaging apparatus 101 so that the center of the concentric circles is positioned on the optical axis 161 of the imaging optical system 111, and so that light passing through the imaging optical system 111, i.e. the subject image, is formed on the light receiving surface of the image sensor 121.

The method of manufacturing the image sensor 121 according to Embodiment 4 forms the photodiodes 251 on one principal surface of the first substrate 301, deposits the secondary material in grooves formed on one principal surface of the second substrate 311, joins the first substrate 301 and the second substrate 311, subsequently polishes the other principal surface of the first substrate 301 to form the photoelectric conversion sublayer 201, and polishes the other principal surface of the second substrate 311 to form the support sublayer 261. During the polishing to form the support sublayer 261, the endpoint of polishing can be determined with reference to the thickness of the secondary material deposited on the second substrate 311, thereby improving the film thickness controllability.

Embodiment 5

Next, Embodiment 5 is described. Overall, the image sensor 121 according to Embodiment 5 differs from Embodiment 4 in the properties of the secondary material included in the second layer 191. Also, a method of manufacturing the imaging apparatus 101 according to Embodiment 5 differs from Embodiment 4 in the timing at which polishing to form the second layer 191 (step S509) is ended and in the details of the joining method during dice bonding (step S601). The following describes the differences from Embodiment 4.

As in Embodiment 4, the primary material regions and the secondary material regions are arranged alternately in the first direction in the support sublayer 261 of the second layer 191 provided in the image sensor 121. For example, the primary material of the support sublayer 261 (for example, silicon) and a third material, which is a secondary material, are arranged alternately. The third material differs in hardness from the primary material and is, for example, a metallic material or an inorganic material. Examples of materials usable as the metallic material include tungsten and copper. Examples of materials usable as the inorganic material include silicon nitride, silicon oxide, and a TEOS film.

Figure 29A:
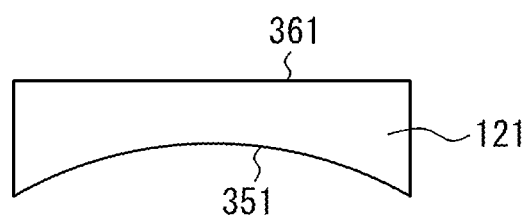
FIGS. 29A and 29B illustrate the cross-sectional shape of an image sensor according to Embodiment 5 of this disclosure.

Next, the polishing to form the second layer 191 (step S509) is described. In this embodiment, polishing only stops after continuing for a predetermined time (overpolishing) after the point at which the secondary material is exposed on the surface being polished. As described above, the primary material and the secondary material included in the second layer 191 have different harnesses. As a result, for example when the hardness of the secondary material is greater than that of the primary material, more of the primary material is polished by overpolishing. Also, the polishing rate in the region where the primary material and the secondary material are arranged alternately can be controlled by adjusting the distribution of the secondary material in the first direction in this region. At least a portion of the surface being polished, i.e. at least a portion of the principal surface on the back side of the image sensor 121, thus becomes concave or convex. FIG. 29A illustrates an example of the entire principal surface 351 on the back side of the image sensor 121 being concave. As described below, the shape of the principal surface 351 on the back side of the image sensor 121 is transferred to the shape of a light receiving surface 361 of the image sensor 121. The properties of the materials, the distribution of the secondary material in the first direction, and the time for overpolishing are freely determined in accordance with the desired shape of the light receiving surface 361 of the image sensor 121.

Figure 29B:
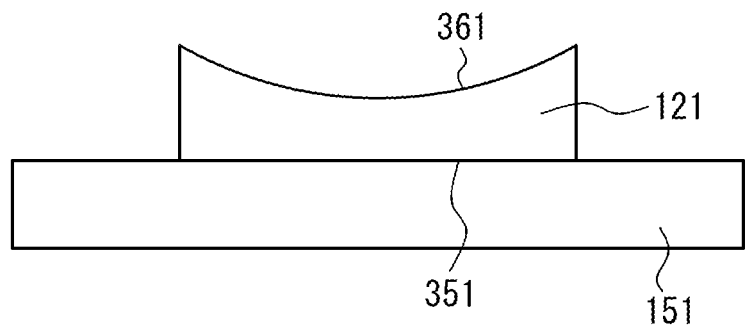

Next, the joining method during dice bonding (step S601) is described in detail. In this embodiment, the image sensor 121 is joined under suction to the package substrate 151 side at the time of dice bonding. As a result of suction, the shape of the principal surface 351 on the back side of the image sensor 121 is transferred to the shape of the light receiving surface 361 of the image sensor 121. For example, FIG. 29B illustrates an example in which the image sensor 121 illustrated in FIG. 29A, i.e. the image sensor 121 in which the entire principal surface 351 at the back side is concave, is joined under suction to the package substrate 151 side. In FIG. 29B, the shape of the principal surface 351 at the back side is transferred to the light receiving surface 361 of the image sensor 121 (and to the principal surface at the front side of the first layer), which becomes concave.

In this way, in the image sensor 121 according to Embodiment 5, at least a portion of the principal surface 351 of the second layer 191 on the opposite side of the first layer 181, i.e. at least a portion of the principal surface 351 at the back side of the second layer 191, is concave or convex. Here, the uneven shape of the principal surface 351 on the back side of the second layer 191 is formed during a pre-process of a semiconductor process, for example by the above-described polishing in step S509 (see FIG. 27). As in Embodiment 4, to obtain the desired uneven shape, an additional procedure after the polishing in step S509, i.e. an additional procedure when the image sensor 121 is relatively thin, is therefore unnecessary, preventing an increase in the difficulty of manufacturing the image sensor 121.

In the image sensor 121, the principal surface at the back side of the second layer 191 differs in shape in accordance with the distribution, in the first direction, of the secondary material in the second layer 191. For example, when the hardness of the secondary material is greater than that of the primary material, the polishing rate is lower as the distribution of the secondary material is greater in a region. Consequently, the image sensor 121 can be provided with any curved shape by adjusting the distribution in the first direction of the secondary material in the second layer 191.

This disclosure is based on the drawings and on embodiments, but it should be noted that a person of ordinary skill in the art could easily make a variety of modifications and adjustments based on this disclosure. Therefore, such changes and modifications are to be understood as included within the scope of this disclosure. For example, the functions and the like included in the various components and steps may be reordered in any logically consistent way. Furthermore, components or steps may be combined into one or divided.

While examples of a back-illuminated image sensor have been described in the above embodiments, this disclosure may also be applied to a front-illuminated image sensor.

The invention claimed is:

1. An image sensor comprising:
a first layer comprising an imaging function, and a plurality of pixels arranged in the first layer in at least a first direction; and
a second layer comprising a metallic sublayer and a support sublayer; wherein
the metallic sublayer is joined to an entire surface of the first layer in the first direction, and is composed of a secondary material being a metallic material; and
the support sublayer comprises primary material regions, including primary material, and secondary material regions, including the secondary material, arranged alternately in the first direction in the support sublayer, and the primary material regions and the secondary material regions extending in a direction perpendicular to the first direction from a front surface of the support sublayer that is adjacent to the metallic sublayer to a back surface of the support sublayer.

2. The image sensor of claim 1, wherein the primary material includes a non-metallic material, and the secondary material includes the metallic material.

3. The image sensor of claim 1, wherein the secondary material regions extend to a surface of the second layer on an opposite side of the first layer.

4. The image sensor of claim 1, wherein in a cross-section along the first direction, the first sublayer includes a portion in which the secondary material regions are uniformly arranged.

5. The image sensor of claim 1, wherein the image sensor is back-illuminated.

6. The image sensor of claim 1, wherein at least a portion of a first surface of the first layer on an opposite side of the second layer, or at least a portion of a second surface of the second layer on an opposite side of the first layer is concave or convex.

7. The image sensor of claim 6, wherein the secondary material is expandable or contractible.

8. The image sensor of claim 6, wherein
the at least a portion of the second surface is a polished formation that has a shape that is concave or convex, and
the first surface has the shape of the second surface when joined to a package substrate.

9. The image sensor of claim 6, wherein in a cross-section along the first direction, at least one of a shape of the first surface and a shape of the second surface differs in accordance with arrangement of the secondary material in the first sublayer.

10. The image sensor of claim 6, wherein in the first sublayer, the primary material regions and the secondary material regions are arranged alternately in substantially concentric circles.

11. The image sensor of claim 1, wherein
a first conductive type semiconductor material and a second conductive type semiconductor material are arranged in the secondary material regions, and
a first electrode, the first conductive type semiconductor material and the second conductive type semiconductor material, and a second electrode are layered in the second layer in a direction from the second layer towards the first layer to form a Peltier device.

12. The image sensor of claim 11, wherein the first electrode extends to a surface of the second layer on an opposite side of the first layer.

13. An imaging apparatus comprising:
an imaging optical system configured to form an image of a subject on a light receiving surface of a first layer of an image sensor; and
the image sensor comprising the first layer and a second layer joined to the first layer,
the first layer comprising an imaging function, and a plurality of pixels arranged in the first layer in at least a first direction, and
the second layer comprising a metallic sublayer and a support sublayer, wherein the support sublayer includes primary material regions, including primary material, and secondary material regions, including secondary material, arranged alternately in the first direction in the support sublayer, and the primary material regions and the secondary material regions extending in a thickness direction perpendicular to the first direction from a front surface to a back surface of the support sublayer, and wherein the metallic sublayer is composed of the secondary material, and is positioned between an entirety of the first layer and the front surface of the support sublayer.

14. An image sensor comprising:
a first layer having an imaging function, the first layer comprising a plurality of pixels arranged in the first layer and on a front side of the image sensor in at least a first direction; and
a second layer joined to the first layer, the second layer comprising a first sublayer and a metallic sublayer; wherein
the first sublayer comprises primary material regions including primary material, and secondary material regions including metallic secondary material, the primary material regions and the secondary material regions are arranged alternately in the first direction in the first sublayer, and extend in a direction perpendicular to the first direction from a front surface of the first sublayer to a back side of the image sensor, and
the metallic sublayer is composed of the metallic secondary material, and is positioned between the first layer and the front surface of the first sublayer.

15. The image sensor of claim 14, wherein in a cross-section along the first direction, the first sublayer includes a portion in which the secondary material regions are uniformly arranged.

16. The image sensor of claim 14, wherein at least a portion of a first surface of the first layer on an opposite side of the second layer, or at least a portion of a second surface of the second layer on an opposite side of the first layer is concave or convex.

17. The image sensor of claim 16, wherein in a cross-section along the first direction, at least one of a shape of the first surface and a shape of the second surface differs in accordance with arrangement of the secondary material in the first sublayer.

18. The image sensor of claim 16, wherein in the first sublayer, the primary material regions and the secondary material regions are arranged alternately in substantially concentric circles.

\* \* \* \* \*